United States Patent
Matsuzaki et al.

(10) Patent No.: US 6,657,248 B1
(45) Date of Patent: Dec. 2, 2003

(54) SEMICONDUCTOR DEVICE HAVING GROOVE ISOLATION STRUCTURE AND GATE OXIDE FILMS WITH DIFFERENT THICKNESS

(75) Inventors: Nozomu Matsuzaki, Kokubunji (JP); Takashi Kobayashi, Tokorozawa (JP); Hitoshi Kume, Musashino (JP); Toshiyuki Mine, Fusa (JP); Kikuo Kusukawa, Yoshikawa (JP); Norio Suzuki, Mito (JP); Kenji Takahashi, Tokyo (JP); Toshiaki Nishimoto, Higashimurayama (JP); Masataka Kato, Koganei (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/432,460

(22) Filed: Nov. 2, 1999

(30) Foreign Application Priority Data

Nov. 2, 1998 (JP) .............................. 10-311612

(51) Int. Cl.⁷ ..................... H01L 27/108; H01L 29/76; H01L 29/94; H01L 31/119; H01L 29/00
(52) U.S. Cl. ........................ 257/306; 257/506
(58) Field of Search ................. 257/506–510, 257/314–324, 295–310; 438/207–218, 294–296, 241–253, 396–398

(56) References Cited

U.S. PATENT DOCUMENTS

| 5,350,941 A | 9/1994 | Madan |
| 5,858,830 A | 1/1999 | Yoo et al. ................... 438/241 |
| 5,861,347 A * | 1/1999 | Maiti et al. .................. 438/264 |
| 6,107,134 A | 8/2000 | Lu et al. ..................... 438/239 |

FOREIGN PATENT DOCUMENTS

| JP | 61-214446 | 9/1986 |
| JP | 2-260660 | 10/1990 |
| JP | 9-181163 | 7/1997 |

* cited by examiner

*Primary Examiner*—Cuong Quang Nguyen
(74) *Attorney, Agent, or Firm*—Antonelli, Terry, Stout & Kraus, LLP

(57) ABSTRACT

There was a problem that sharpening of a substrate and localized increase in the thickness of a gate oxide film become more remarkable as the thickness of the gate oxide film is increased to degrade the gate withstand voltage at the surface edge of shallow groove isolation structure. In the present invention, a bird's beak is disposed at the surface edge of a shallow isolation structure GROX11 just below gate electrode POLY11 and in contact with the gate insulation film HOX1 to form the gate insulation film HOX1 previously. This can ensure normal gate withstand voltage of the MOS transistor and favorable device isolation withstand voltage and increased integration degree simultaneously.

9 Claims, 32 Drawing Sheets

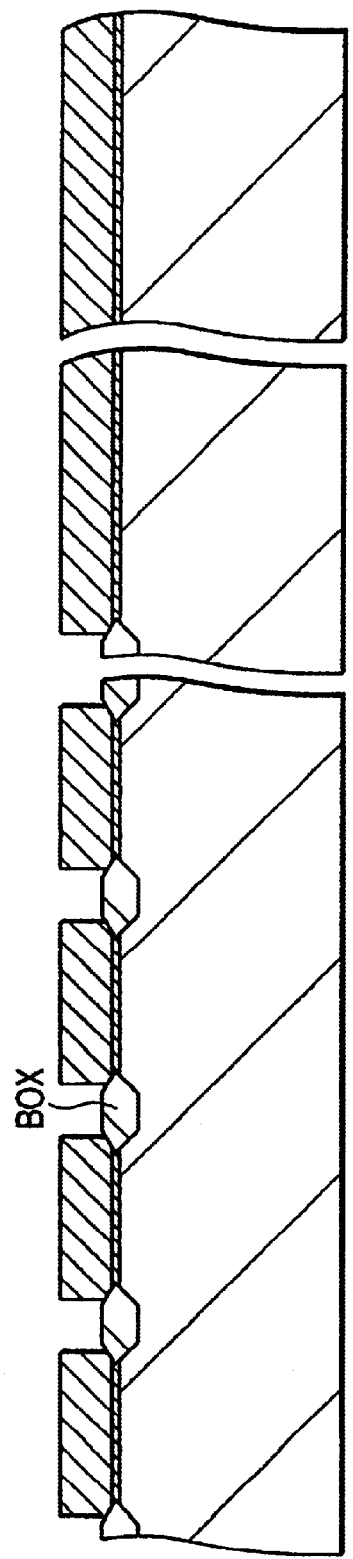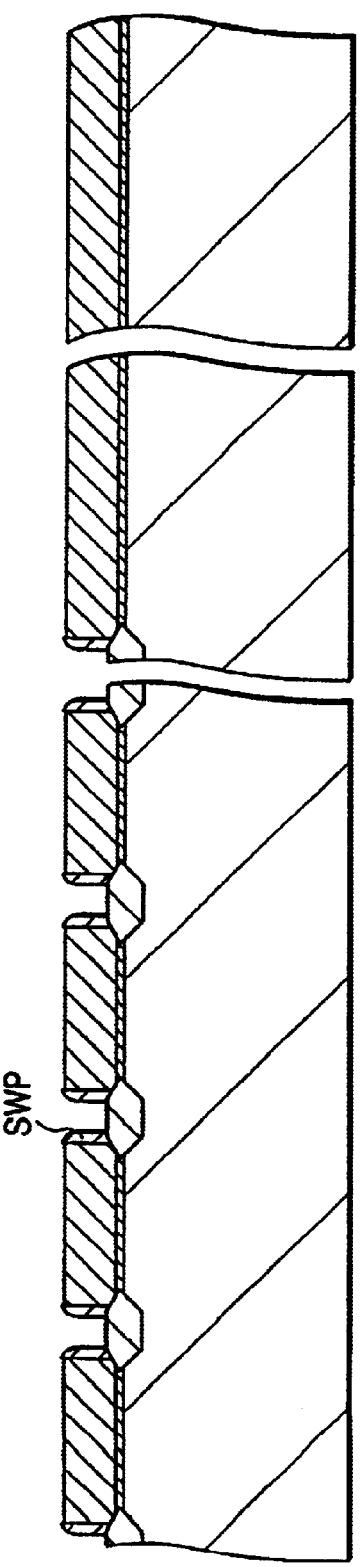

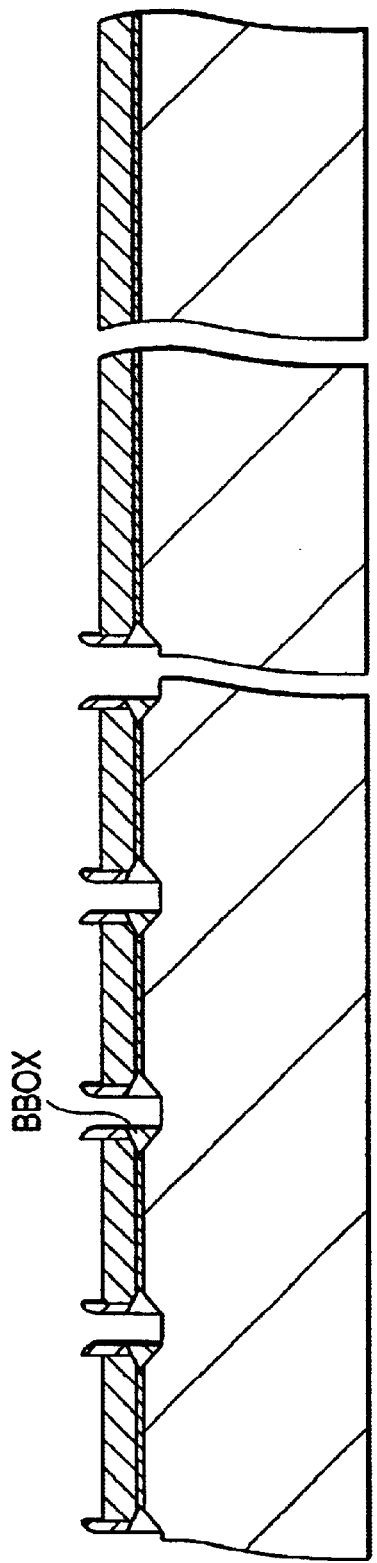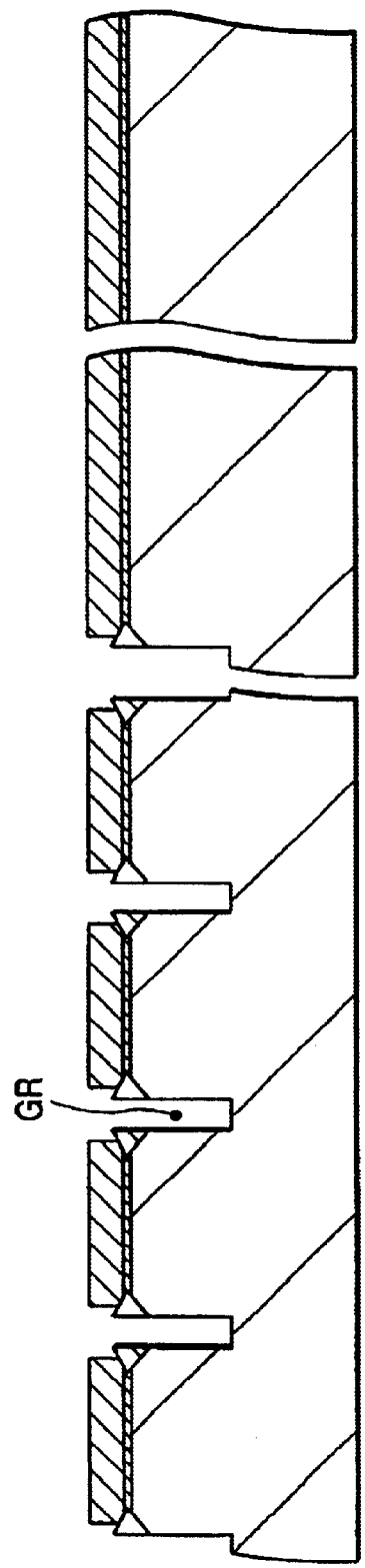

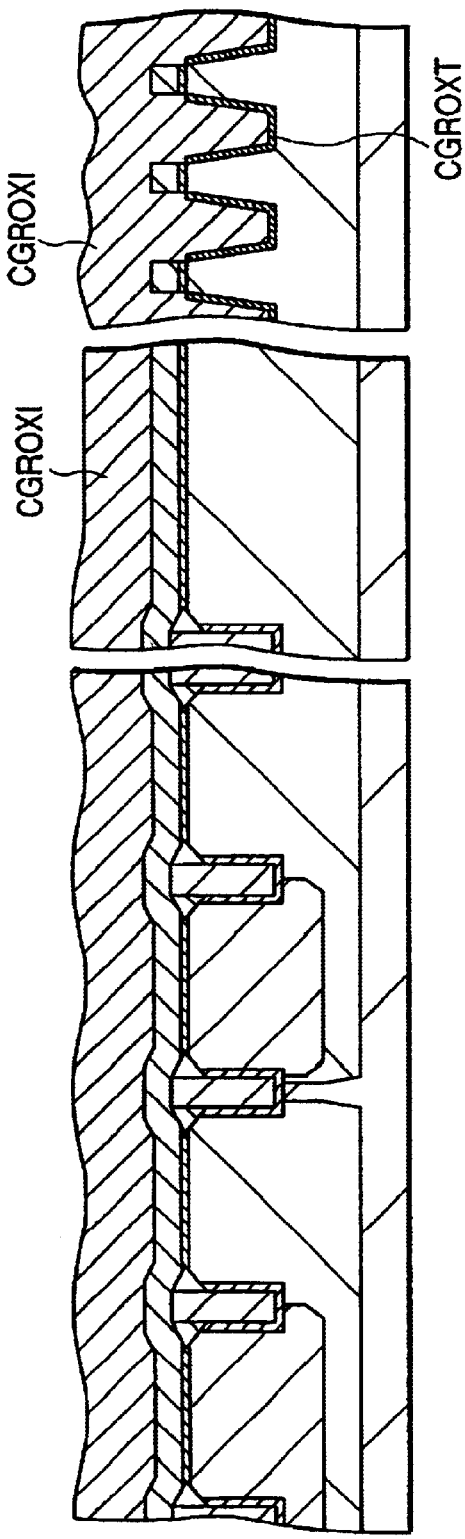
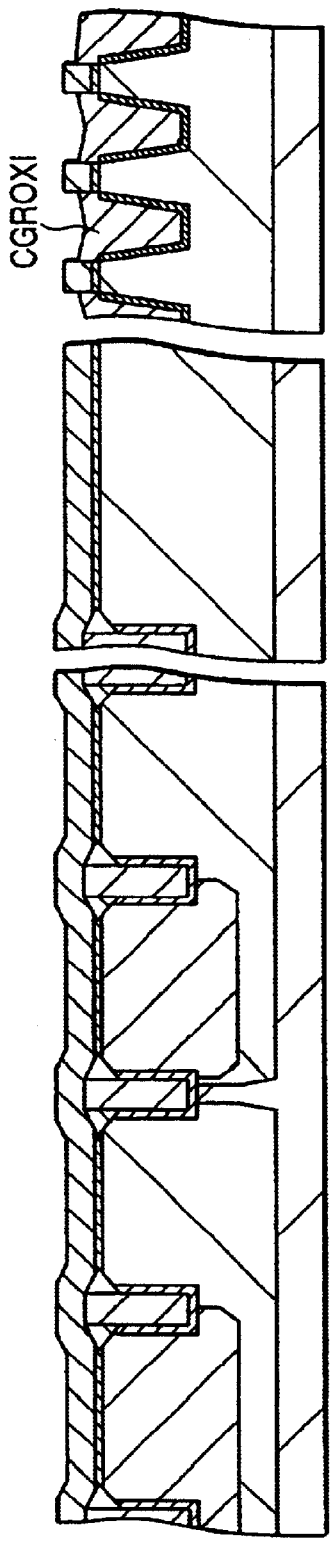

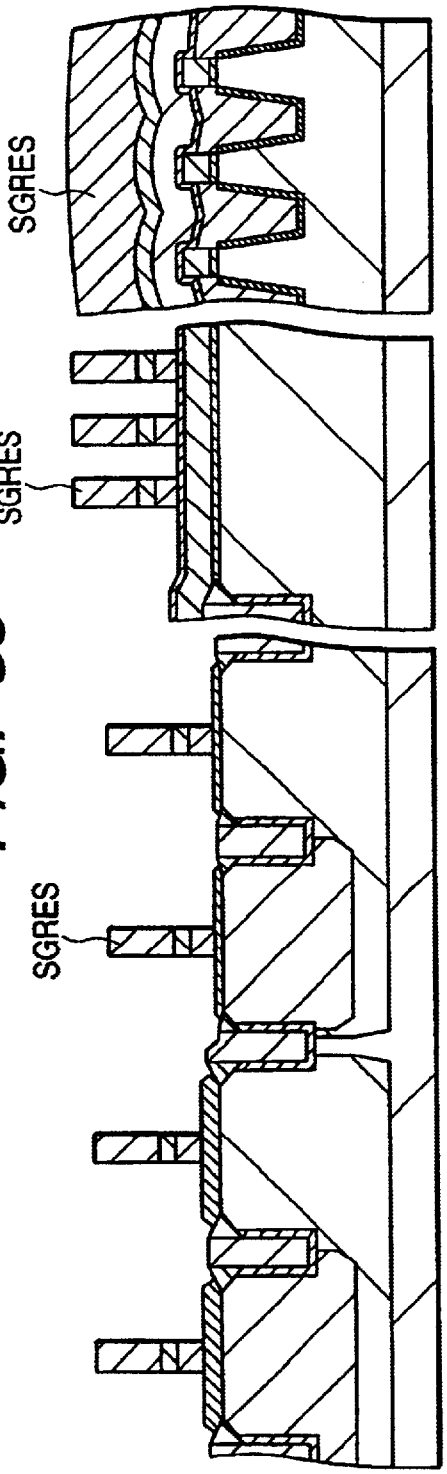
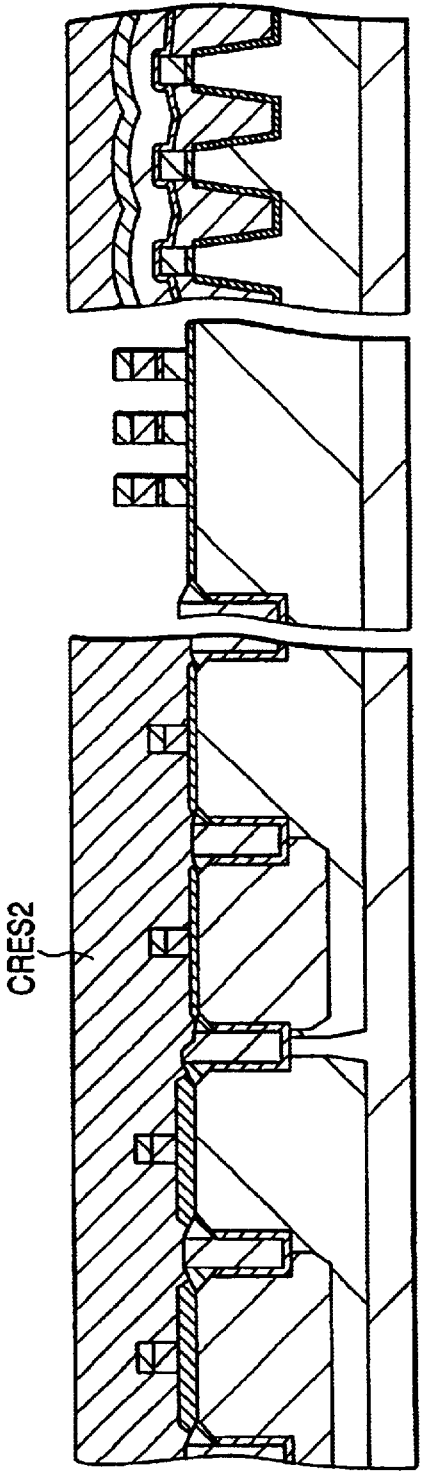
FIG. 33
FIG. 34

FIG. 40
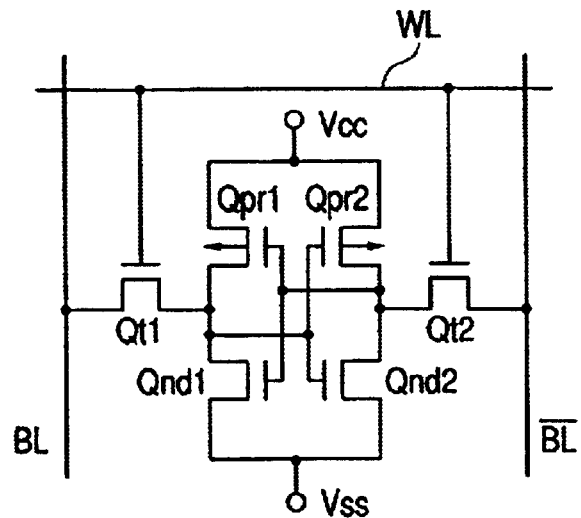
FIG. 41
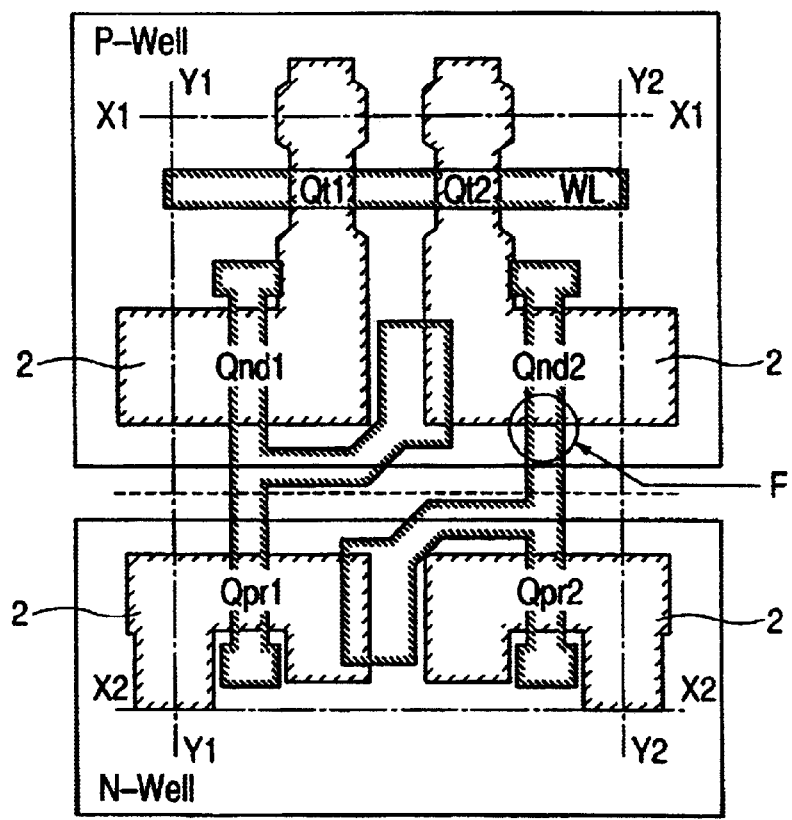
 GATE ELECTRODE      ACTIVE AREA

BACKGROUND INFORMATION

SEMICONDUCTOR DEVICE HAVING GROOVE ISOLATION STRUCTURE AND GATE OXIDE FILMS WITH DIFFERENT THICKNESS

BACKGROUND OF THE INVENTION (1) Field of the Invention

The present invention concerns a device isolation structure in a semiconductor device including MOS transistors, a manufacturing method thereof and an application method thereof.

(2) Description of the Prior Art

As a device isolation technique in semiconductor devices, a method of filling the inside of a shallow groove opened in the surface of a substrate with an insulation material has been known. Typical literatures disclosing the related art are shown below.

(1) Literatures described in "I. Triple Ease, 1994, International Electron Device Meeting, Technical Digest", p675–p678, (2) literatures described in "I. Triple Ease, 1996, International Electron Device Meeting, Technical Digest", p829–p832, (3) Japanese Published Unexamined Patent Application No. Sho 61-214446, (4) Japanese Published Unexamined Patent Application No. Hei 2-260660, (5) Japanese Published Unexamined Patent Application No. Hei 6-204333 and (6) Japanese Published Unexamined Patent Application No. Hei 9-181163.

The known literature (1) describes use of a shallow device isolation structure together with a device isolation structure by selective thermal oxidation (LOCOS). This is said to be an effective technique for preventing excess polishing which causes problem in chemical mechanical polishing method (hereinafter referred to as CMP). However, since the surface step is similar with that in the existent LOCOS, it can not cope with a narrow lithographic focus latitude upon conducting refined side fabrication.

Accordingly, the known technique (1) does not always meet refinement and high integration degree of semiconductor devices.

The technique disclosed in the known reference (2) forms a thermal oxide film of 50 nm to 100 nm in a device isolation area and then shallow groove is opened by disposing a spacer made of an insulator on the side wall of a mask layer used upon thermal oxidation. In this technique, since the spacer remains upon filling the inside of the groove, the aspect ratio (depth to width) of the groove increases. Therefore, it is difficult to fill the inside of the groove, which hinders refinement. For improving the integration degree in a semiconductor memory or improving the performance of a microprocessor by forming a fine MOS transistor, it is very much important to form a fine shallow groove isolation structure.

Sharpening of a substrate at the surface edge of the shallow groove isolation structure and localized decreasing in the thickness of the gate oxide film become more remarkable as the thickness of the gate oxide film is increased. That is, as the film thickness increases, a tunnel current through the gate oxide film flows at a lower electric field.

FIG. 46 shows a relation between an electric field applied to the gate oxide film and a tunnel current flowing through the oxide film. A specimen used for the measurement is a rectangular MOS capacitor surrounded at four sides with a shallow groove isolation area formed by the prior art. The thickness of the thermal oxide shown in the drawing is that for a flat portion. As shown in FIG. 46, as the thickness of the thermal oxide film is larger, a tunnel current flows from a lower electric field and a dielectric break down voltage is also lowered. This is caused by the decrease in the thickness of the gate oxide film and sharpening of the substrate occurring at the surface edge of the shallow groove. This causes degradation of the gate withstand voltage of MOS transistors.

Since a semiconductor nonvolatile memory treats a high voltage at the inside, a MOS transistor having thick gate oxide film is necessary. Further, also in a microprocessor operating at a low internal voltage, since I/O section requires a circuit for treating a high voltage, it requires an MOS transistor having a thick gate oxide film. The situation is identical also in a semiconductor device in which a DRAM memory and a microprocessor are formed on one identical substrate, so long as I/O is concerned.

Existent shallow groove isolation structures are suitable to MOS transistors having thin gate oxide film, but the foregoing undesired phenomenon becomes conspicuous as the thickness of the gate oxide film increases. Accordingly, it is impossible to conduct desired operation of semiconductor devices by the use of the prior art to the semiconductor devices. None of the known literatures discloses the technique capable of overcoming the problems. Then, it is extremely important to solve the problems.

SUMMARY OF THE INVENTION

As a means for solving the foregoing problems, in an MOS structure having gate oxide films at a plurality of levels for the thickness on one identical substrate (for example, silicon substrate), a relation: $R \geq r$ is defined providing that $H \geq h$ between a radius of curvature R at a surface edge of a groove isolation structure on the side of a substrate in contact with a gate insulation film of a thickness H and a radius of curvature r at a surface edge of a groove isolation structure on the side of the substrate in contact with a gate oxide film of a thickness h. The relation can be considered as shown in FIG. 1. The radius of curvature for the corner at the surface edge of a shallow groove isolation on the side of the substrate where shallow groove isolation area disposed on SUB11 and a gate dielectric HOX1 are in contact with each other is assumed as R. GROXI11 is a silicon oxide film for device isolation filled in the shallow groove. POLY11 is a gate electrode present just thereon. A radius of curvature for the corner at the surface edge of a shallow groove isolation area on the side of the substrate where shallow groove isolation disposed on SUB11 and a gate oxide film LOX1 are in contact with each other is assumed as r. GROXI12 is a silicon oxide film for device isolation filled in the shallow groove. POLY12 is a gate electrode present just thereon. The feature of the present invention resides in establishing a relation: $R \geq r$, providing that $HOX1 \geq LOX1$.

As another means for dissolving the dissolving problems, a relation $H \geq h$ is defined in an MOS structure having gate oxide films at a plurality of levels for thickness on one identical substrate, in which T is a step between the top of the side wall plane of the shallow groove in contact with a gate oxide film of a thickness H and the bottom of a gate oxide film of a thickness H, and it is a step between the top of the side wall plane of the shallow groove in contact with a gate oxide film of a thickness L and the bottom of a gate oxide film of a thickness L, providing that $H \geq h$.

The meaning is to be explained with reference to FIG. 2. T is a difference of height between the top of the shallow groove side wall and the bottom of the gate oxide film at the surface edge of shallow groove isolation where the shallow groove isolation area disposed on SUB21 and the gate dielectric HOX2 are in contact with each other. GROXI21 is an oxide film for device isolation filled in the shallow groove. POLY21 is a gate electrode present just thereon. t is a difference of height between the top of the shallow groove side wall and the bottom of the gate oxide film at the surface edge of shallow groove isolation where the shallow groove isolation area disposed on SUB12 and the gate dielectric LOX2 are in contact with each other. GROXI22 is an oxide film for device isolation filled in the shallow groove. POLY22 is a gate electrode present just thereon. The feature of the present invention resides in establishing the relation T≧t, providing that HOX1≧LOX1.

As a further means for dissolving the foregoing problems, a relation: D≧d is defined in an MOS structure having gate oxide films at a plurality of levels for thickness on one identical substrate, in which D is a length along an inclined surface continuous from a horizontal bottom of a gate oxide film of a thickness H toward the top of the steepest side wall plane the shallow groove in contact with the gate oxide film of a thickness H, and d is a length along an inclined surface continuous from a horizontal bottom of a gate oxide film of a thickness L toward the top of the side wall plane of the shallow groove in contact with the gate oxide film of a thickness L, providing that H≧L.

In this case, the substrate can be a silicon substrate and the oxide film can be a silicon oxide film.

The meaning is to be explained with reference to FIG. 3. D is a length of an area where the bottom of the gate oxide film is inclined toward the top of the steepest side wall plane of the shallow groove at the surface edge of the shallow groove isolation where the shallow groove isolation area disposed on SUB31 and the gate dielectric HOX3 are in contact with each other. GROXI31 is a silicon oxide film for device isolation filled in the shallow groove. POLY31 is a gate electrode present just thereon. d is a length of an area where the bottom of the gate oxide film is inclined toward the top of the steepest side wall plane of the shallow groove at the surface edge of the shallow groove isolation where the shallow groove isolation area disposed on SUB32 and the gate dielectric LOX3 are in contact with each other. GROXI32 is a silicon oxide film for device isolation in the shallow groove. POLY32 is a gate electrode present just thereon. The feature of the present invention resides in establishing the relation: D≧d, providing that HOX1≧LOX1.

The concept of the present invention is to make the structure of the surface edge of the shallow groove isolation different corresponding to the thickness of the gate oxide film. This concept is applicable also to a case in which the gate dielectric is formed by chemical vapor deposition.

If the gate dielectric is formed by chemical vapor deposition, localized decrease in the thickness of the gate oxide film as caused by the thermal oxidation step can be avoided. However, the shape for the surface edge of the shallow groove isolation is still sharp if it is merely formed by the process, and the situation is identical in that the radius of curvature on the side of the substrate has to be set corresponding to the concentration of the electric field. Accordingly, also in the use of the gate dielectric formed by chemical vapor deposition, the present invention is also effective and necessary. Such a structure is important in an area forming the MOS structure as disclosed in FIG. 1 to FIG. 3. That is, the present invention is important for such a structure where the gate electrode is present at the surface edge of the shallow groove isolation and a gate electrode is present just thereon.

A manufacturing means for realizing the present invention comprises:

a step of depositing a thermal oxide mask layer on a silicon substrate, a step of exposing a substrate in an area forming a device isolation structure, a step of thermally oxidizing the exposed surface of the silicon substrate thereby providing a bird's beak to the surface edge of a device isolation area, a step of forming a spacer made of a material to be removed simultaneously with etching for the substrate to the side wall of the thermal oxide mask layer, a step of anisotropically fabricating the thermal oxide film on the surface of the substrate using the thermal oxide mask layer and the spacer as a mask, a step of anisotropically fabricating the exposed silicon substrate thereby forming a shallow groove, a step of completely filling the inside of the shallow groove with an insulation material, a step of retracting the field material thereby exposing the above-mentioned thermal oxide mask layer, a step of removing the thermal oxidation mask layer thereby exposing a silicon substrate, a step of forming a first gate insulation film on the exposed substrate, a step of removing a first gate insulation material on a portion of an area thereby exposing the silicon substrate again, a step of forming a second gate insulation film to the exposed surface of the substrate, and a step of forming a gate electrode.

The thickness of the first gate dielectric is greater than that of the second gate dielectric.

The feature of the present invention regarding the shallow groove isolation and the manufacturing method thereof resides in that (A) it is not used together with a device isolation method only for LOCOS, (B) the material of the spacer disposed to the side wall of the mask for aperturing the shallow groove is identical with that for the substrate, or such a material as removed simultaneously upon etching of the substrate, that is, the spacer does not remain upon filling of the shallow groove. The manufacturing method and the structure described above are applied irrespective of the width, length and area of the shallow groove device isolation area.

A further feature in view of the structure according to the present invention resides in an angle at which the side wall of the shallow groove and the surface of the substrate intersect to each other. This becomes conspicuous in the relation between the thickness of the spacer disposed on the side wall of the thermal oxide mask layer and the thermal oxide film for forming the bird's beak at the surface edge.

Problems are shown with reference to FIG. 4a to FIG. 4d and the manufacturing method according to the present invention for overcoming them are shown with reference to FIG. 5a to FIG. 5d. As shown in FIG. 4a, a spacer PSW4 is disposed on the side wall of a thermal oxide mask layer LSIN4 on a thermal oxide film TOX4. The film thickness tSWA of PSW4 is set such that the bottom edge of PSW4 on the side not in contact with LSIN4 is present just on an area where the bottom of the thermal oxide film BOX4 becomes horizontal. BOX4 is cut using PSW4 as a mask to form BBOX4 (FIG. 4b), and when a shallow groove is formed successively, ∠A is approximate to a right angle (FIG. 4c). In such a shape, when the polishing by CMP for the silicon oxide film GROX14 filling the shallow groove is excessive to expose the point A, the substrate is inevitably sharpened upon forming the gate oxide film GODX4 (FIG. 4d). On the other hand, in FIG. 5a, the thickness tSWB of PSW5 is set such that the base edge of the spacer PSW5 on the side not in contact with the thermal oxide mask layer LSIN5 is present just on an area where the bottom of the thermal oxide film BOX5 is inclined. BOX5 is cut at a bird's beak area thereof using LSIN5 and PSW5 just above the thermal oxide film TOX5 as a mask to form BBOX5 (FIG. 5b). When a shallow groove is formed successively, an angle ∠B formed between the inner wall of the shallow groove and the bottom of BBOX5 becomes blunt (FIG. 5c). In this state, even if the point B is exposed by excess polishing by CMP, sharpening of the substrate can be suppressed upon forming the gate oxide film TOX5 (FIG. 5d). It is necessary to provide a shape for making ∠B blunt in order to prevent sharpening at the surface edge of the shallow groove isolation. In the foregoings, a manufacturing method including the formation of the spacer has been explained specifically, but the spacer can be saved so long as the shape of the present invention can be attained finally.

The manufacturing method explained in this chapter is an example for practicing the present invention. It should be understood that the conceptional feature of the present invention is in a relation between the film thickness of the gate dielectric just below the gate electrode and the shape of the surface edge of shallow groove isolation in contact therewith. As has been explained at the last of the preceding chapter, the semiconductor device for which the present invention is most important is, for example, a nonvolatile memory in which gate oxide films are present at a plurality of levels for thickness, a microprocessor, a semiconductor device in which they are formed on one identical substrate and a semiconductor device in which a DRAM memory and a microprocessor are formed on one identical substrate.

Further, although the manufacturing method explained in this chapter is suitable to embody the shallow groove isolation according to the present invention, it is applied and effective also in a case where the gate oxide film is at a single level of thickness. This is because the problem of excess polishing by CMP has to be solved also in a case where the gate oxide is at a single level of thickness.

The foregoing and other objects, advantages, manner of operations, novel features of the present invention will be understood from the following detailed description when read in connection with the accompanying drawings.

BRIEF DESCRIPTION OF THE DRAWINGS

FIG. 15 is a cross sectional view illustrating steps of manufacturing a nonvolatile memory using the present invention;

FIG. 16 is a cross sectional view illustrating steps of manufacturing a nonvolatile memory using the present invention;

FIG. 17 is a cross sectional view illustrating steps of manufacturing a nonvolatile memory using the present invention;

FIG. 18 is a cross sectional view illustrating steps of manufacturing a nonvolatile memory using the present invention;

FIG. 25 is a cross sectional view illustrating steps of manufacturing a nonvolatile memory using the present invention;

FIG. 26 is a cross sectional view illustrating steps of manufacturing a nonvolatile memory using the present invention;

FIG. 33 is a cross sectional view illustrating steps of manufacturing a nonvolatile memory using the present invention;

FIG. 34 is a cross sectional view illustrating steps of manufacturing a nonvolatile memory using the present invention;

FIG. 40 is a CACHE circuit diagram of a semiconductor microprocessor;

FIG. 41 is a view for the planer arrangement of a CACHE circuit of a semiconductor microprocessor;

DESCRIPTION OF THE PREFERRED EMBODIMENTS

The present invention is applicable generally to semiconductor integrated circuit devices requiring a shallow groove structure for device isolation. The summary of the present invention is to be explained with reference to cross sectional views for an MOS transistor having gate oxide films at two levels of thickness.

Figure 6A:
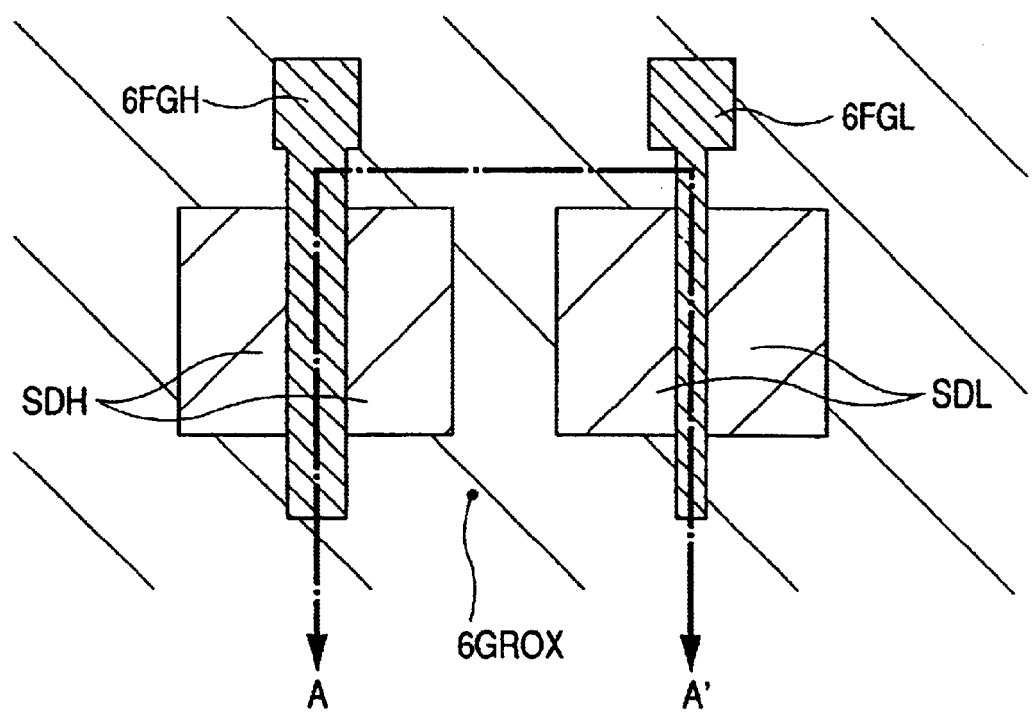
FIG. 6 is a cross sectional view illustrating a manufacturing method according to the present invention.
Figure 6B:
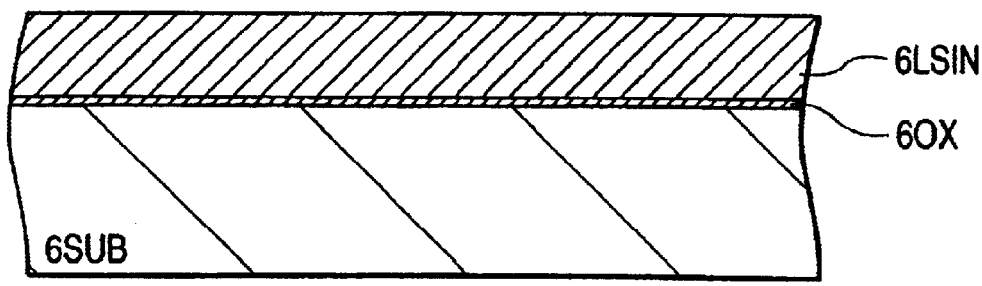

FIG. 6a is a plan view of the MOS transistors. In the figure, are shown a gate electrode 6FGH of an MOS transistor having a thick gate oxide film, source and drain SDH thereof, a gate electrode 6FGL of an MOS transistor having a thin gate oxide film and source and drain SDL thereof. The outside for SDH and SDL is isolated with an oxide film 6GROX. The disclosed cross sectional structure is along A–A' shown in FIG. 6a. Concrete numerical values such as for a film thickness will be described upon disclosing detailed embodiments latter.

Steps for manufacturing the MOS transistor are to be explained with reference to FIG. 6b–FIG. 11c.

Figure 6C:
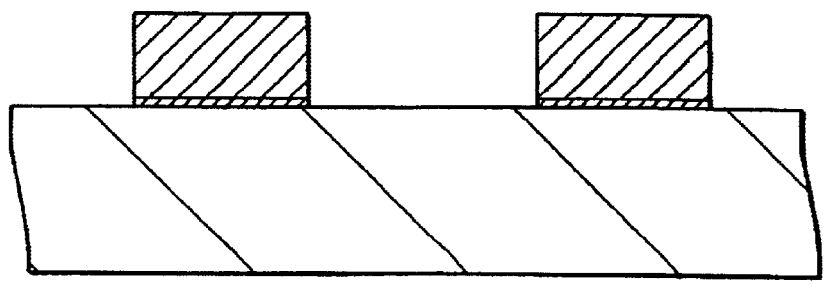

At first, a thermal oxide film 60X is formed on a silicon substrate 6SUB, and a silicon nitride film 6LSIN is deposited just thereon (FIG. 6b). 6LSIN and 60X are removed in a area forming a device isolation structure by using photolithography and dry etching (FIG. 6c).

Figure 5A:
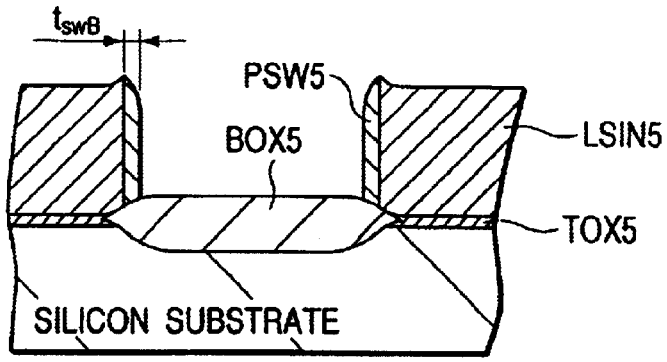
FIG. 5 is a cross sectional view illustrating the feature of the present invention.
Figure 5B:
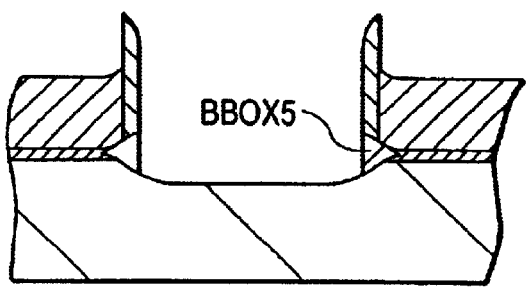
Figure 5C:
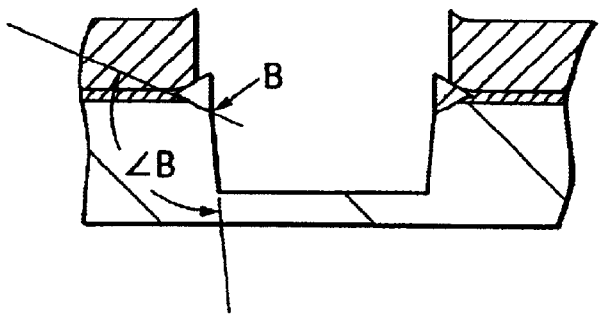
Figure 5D:
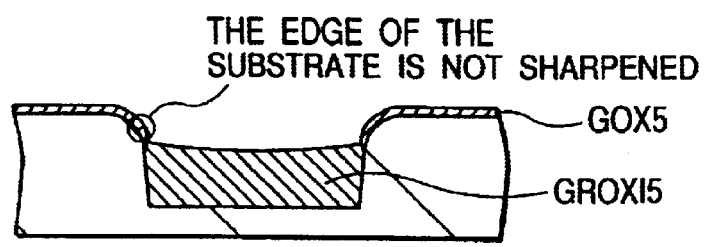
Figure 7A:
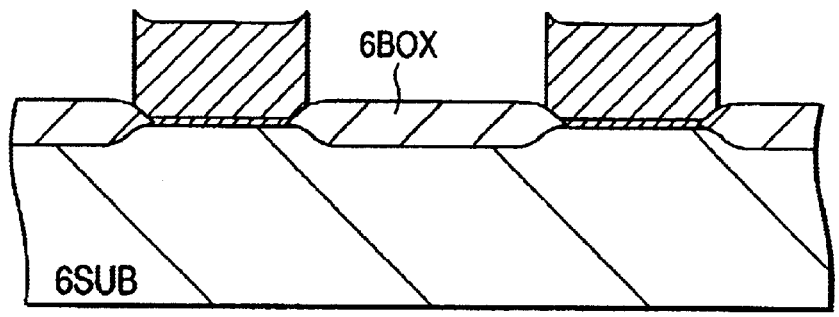
FIG. 7 is a cross sectional view illustrating a manufacturing method according to the present invention.
Figure 7B:
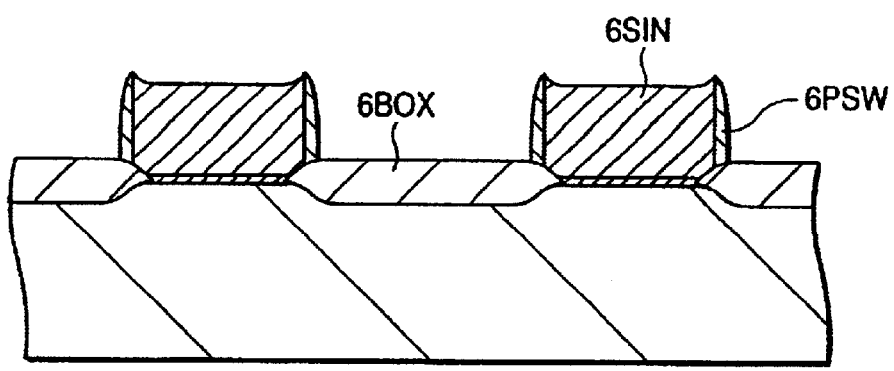
Figure 7C:
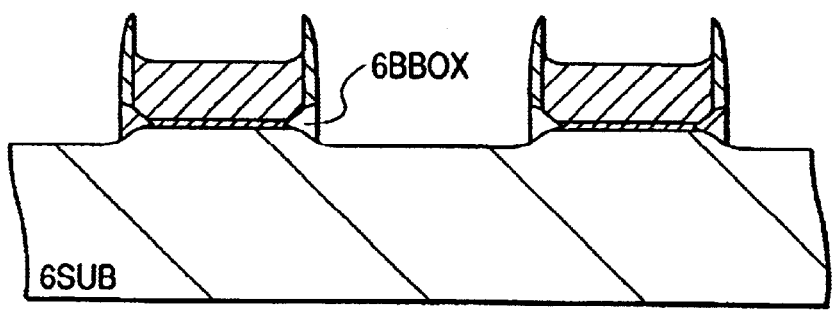

A thermal oxide film 6BOX disposed on the exposed surface of 6SUB (FIG. 7a). A spacer 6PSW comprising polysilicon is formed on the side wall of 6LSIN (FIG. 7b) As explained with reference to FIG. 5a to FIG. 5c, the spacer length is set such that the bottom edge of the spacer is present on an area where the bottom of BOX 6 is inclined. Now, 6BOX is removed by anisotropic dry etching to expose the surface of 6SUB. BOX just below 6PSW is remained as 6BBOX (FIG. 7c).

Figure 8A:
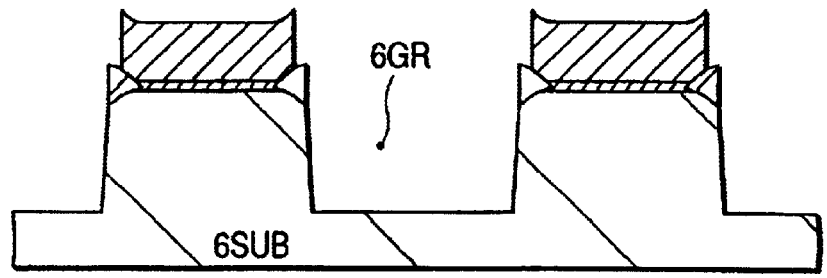
FIG. 8 is a cross sectional view illustrating a manufacturing method according to the present invention.
Figure 8B:
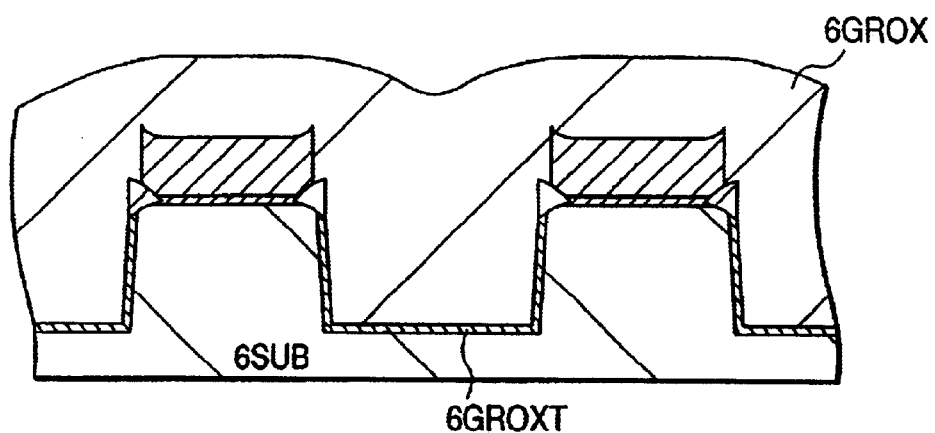
Figure 8C:
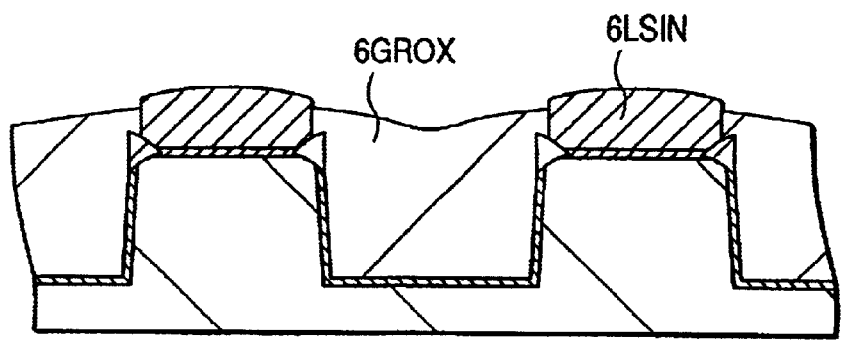
Figure 9A:
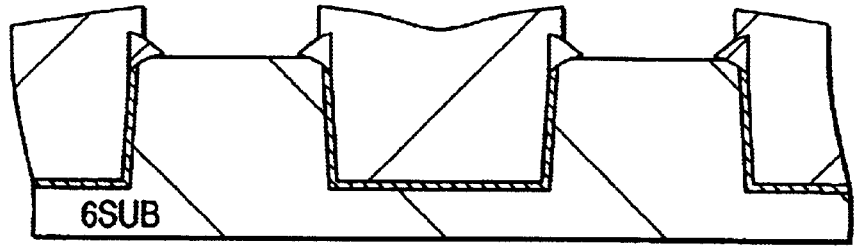
FIG. 9 is a cross sectional view illustrating a manufacturing method according to the present invention.
Figure 9B:
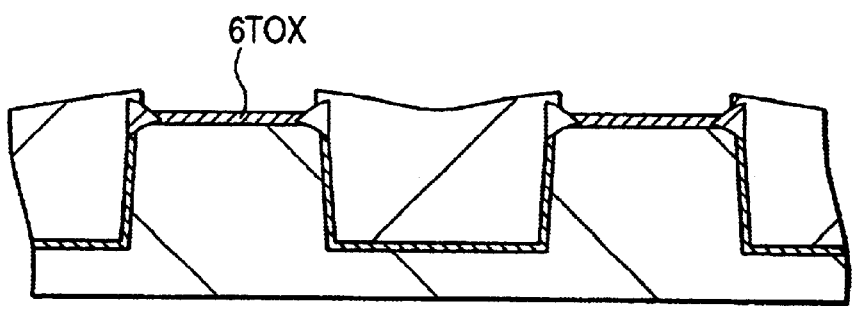
Figure 9C:
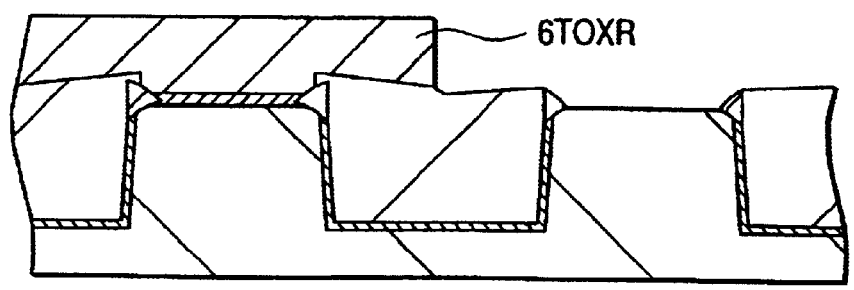
Figure 10A:
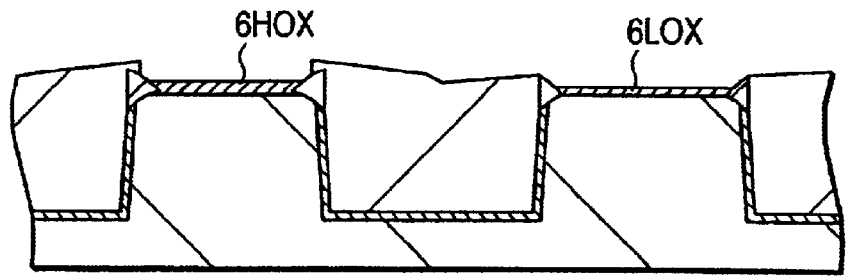
FIG. 10 is a cross sectional view illustrating a manufacturing method according to the present invention.
Figure 10B:
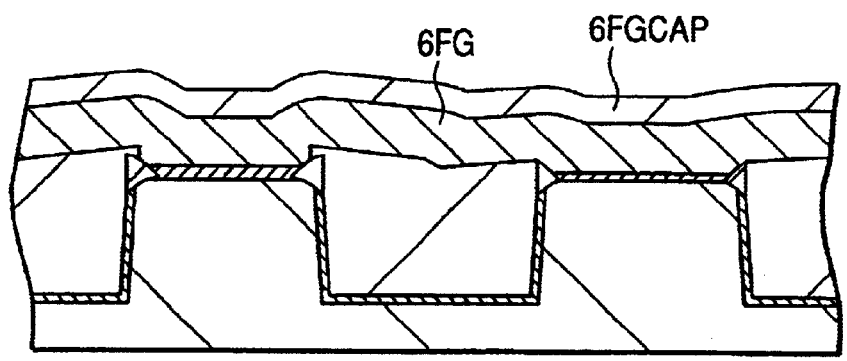
Figure 10C:
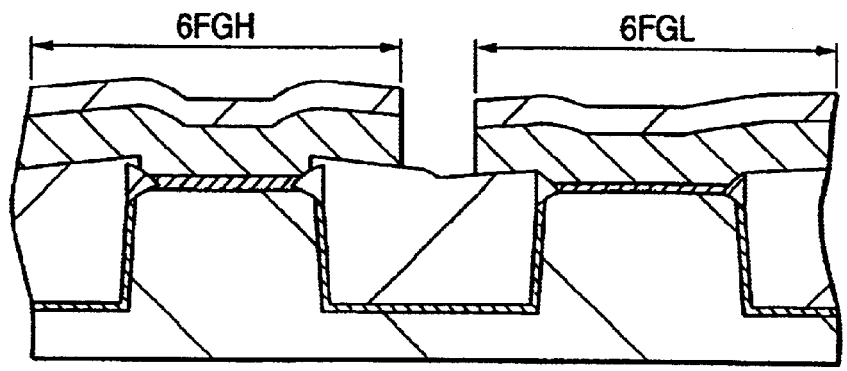

A shallow groove 6GR is formed in 6SUB. 6PSW is removed simultaneously (FIG. 8a). A thermal oxide film 6GROXT is formed on 6SUB exposed to the wall of the groove. Then, a silicon oxide film 6GROX is deposited over the entire surface to completely fill 6GR (FIG. 8b). 6GR is retracted by CMP or dry etching to completely expose 6LSIN (FIG. 8c). 6LSIN is removed with hot phosphoric acid and 60X is removed with hydrofluoric acid. 6SUB is exposed (FIG. 9a). A thermal oxide film 6TOX is formed on the exposed 6SUB (FIG. 9b). A portion of 6TOX is removed by using a photoresist 6TOXR. The removed area is a area for forming a thin gate oxide film and an area not removed with 6TOX is a area for forming a thick gate oxide film (FIG. 9c) respectively. 6TOXR is removed and a thermal oxide film 6LOX is formed to the surface from which 6TOX was removed as described above. The remained 6TOX is oxidized again by the thermal oxidation to be formed into a thicker 6HOX (FIG. 10a). Polysilicon 6FG is deposited over the entire surface and a silicon oxide film 6FGCAP is deposited just thereon. 6FGCAP is used for preventing impurities for forming source drain from intruding into 6FG which forms a gate electrode. 6FG may be made of other materials useful as a gate electrode such as a laminate film with a polysilicon.silicides or a metal (FIG. 10b). 6FG and 6FGCAP are fabricated by using photolithography and dray etching into gate electrodes 6FGH and 6FGL (FIG. 10c).

Figure 1:
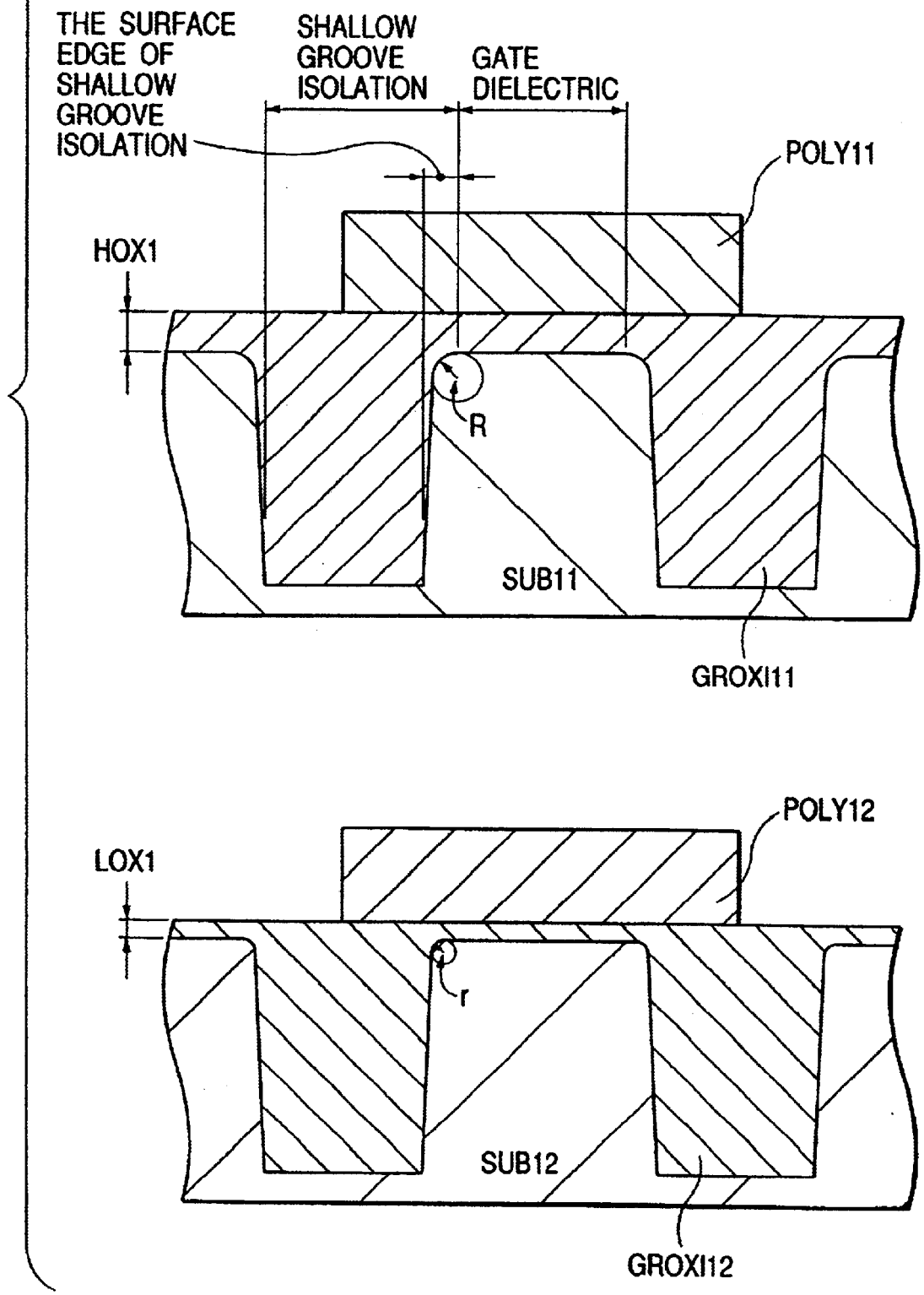
FIG. 1 is a cross sectional view illustrating the feature of the present invention.
Figure 2:
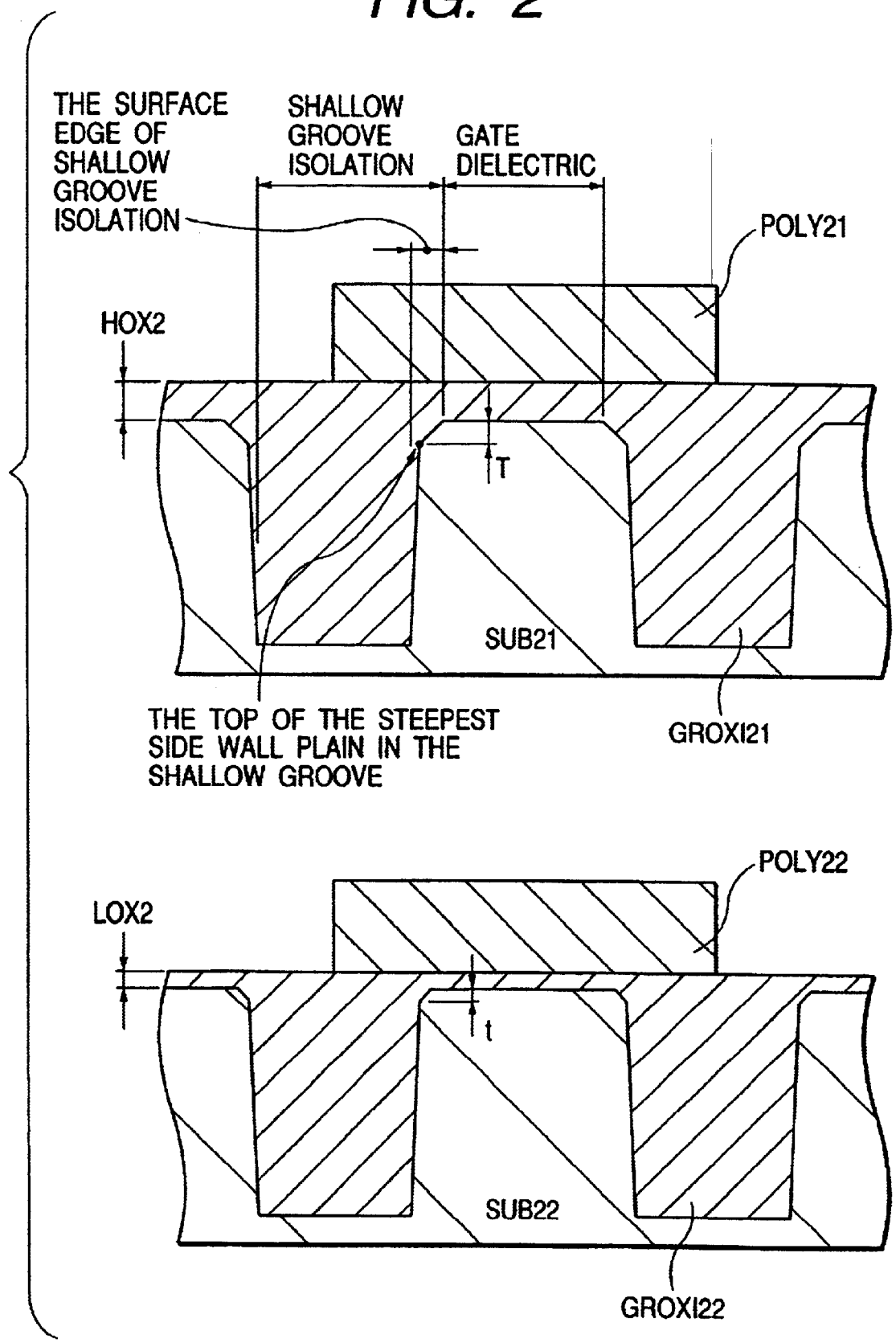
FIG. 2 is a cross sectional view illustrating the feature of the present invention.
Figure 3:
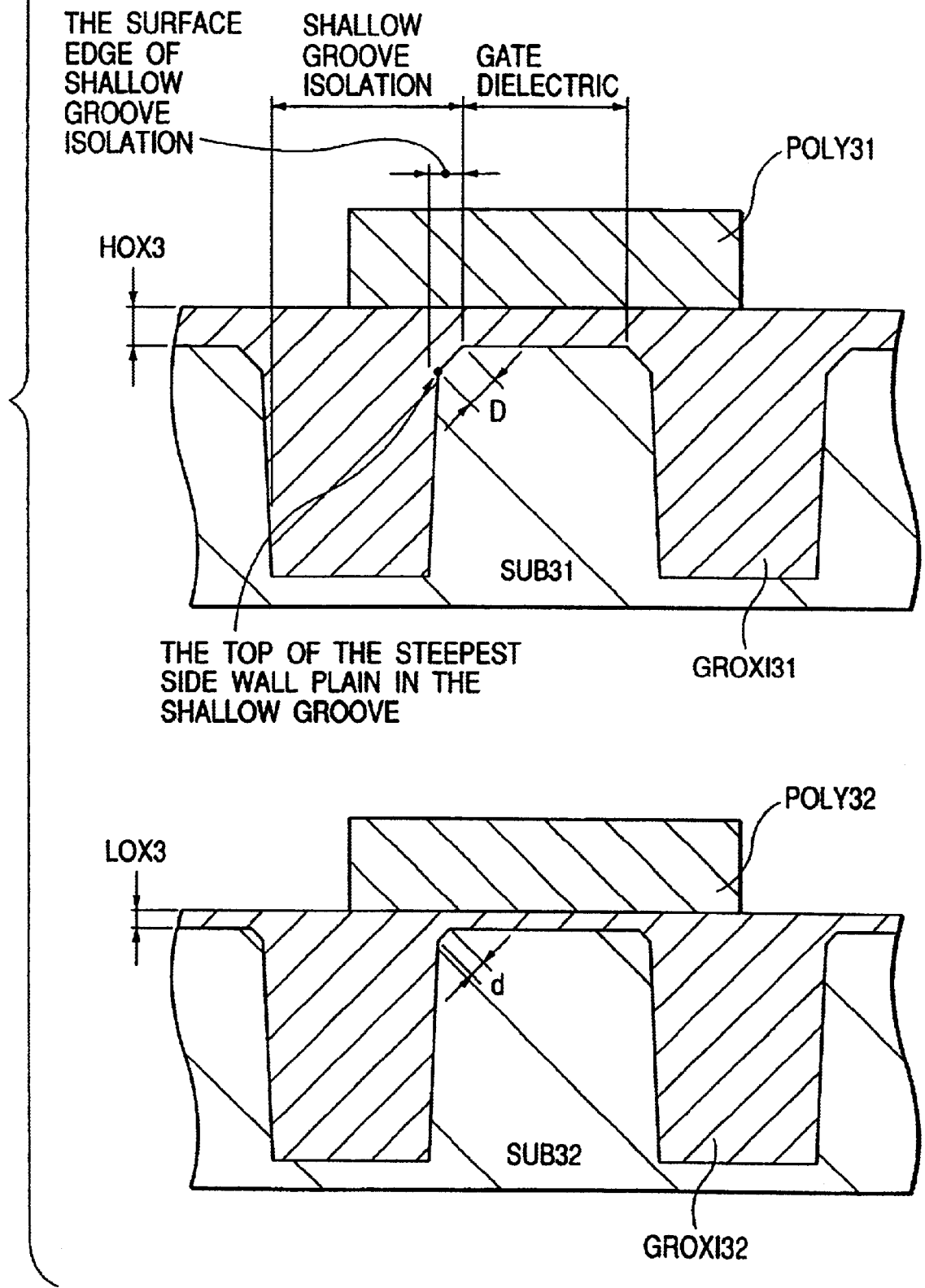
FIG. 3 is a cross, sectional view illustrating the feature of the present invention.
Figure 4A:
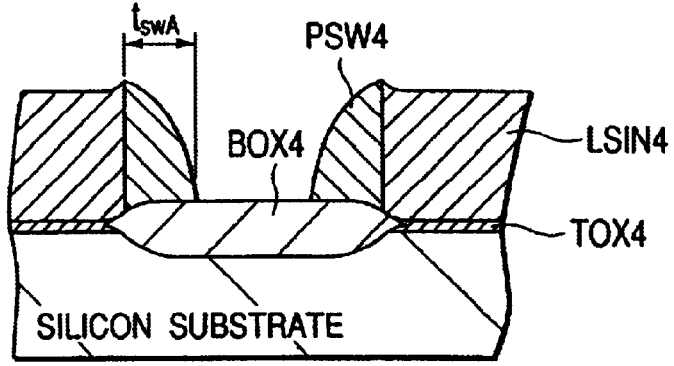
FIG. 4 is a cross sectional view illustrating the feature of the present-invention.
Figure 4B:
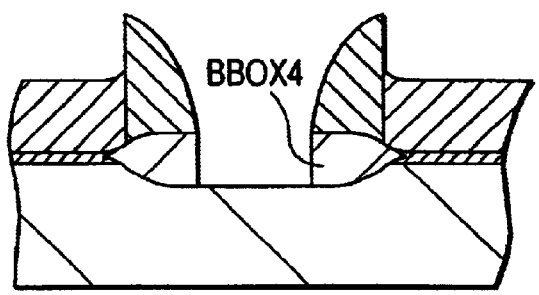
Figure 4C:
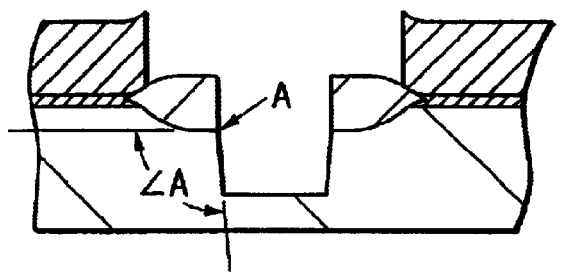
Figure 4D:
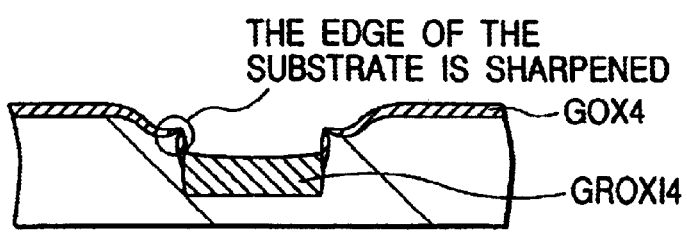

In the final cross section FIG. 10c, the surface edge of shallow groove explained with reference to FIG. 1 to FIG. 3 has been obtained. That is, the curvature R for a corner of the surface edge of the shallow groove on the side of the substrate present below 6FGH is larger than the curvature r of a corner of the surface edge of the shallow groove present below 6FGLT. Alternatively, a step T of the lower edge of the gate oxide film just below 6FGH relative to an intersection between shallow groove side wall and the lower end of the remaining oxide film is greater than the step t of the lower end of the gate oxide film of 6FGL relative to an intersection between the shallow groove side wall and the lower end of the remaining oxide film. Alternatively, a length D for an area in which the lower end of the gate oxide film just below 6FGH is inclined to the top of the shallow groove side wall is larger than a length d for an area in which the lower end of the gate oxide film just below 6FGL is inclined to the top of the shallow groove side wall.

The gist that the disclosed manufacturing method can realize the structure of the present invention resides in the order of steps of forming the initial shape of 6BBOX and the gate oxide film in the order of larger thickness. The curvature for the surface edge of the shallow groove on the side of the substrate, the step of the intersection between the shallow groove side wall and the lower end of the remaining oxide film, or a length for an area in which the lower end of the gate oxide film is inclined to the top of the shallow groove side wall is at the maximum in FIG. 7c. The value is determined by the shape of 6BBOX. In the subsequent steps, 6BBOX is retracted on every cleaning and the substrate is retracted on every thermal oxidation. That is, the shallow groove isolation structure in the present invention can be attained by forming the layer in the order of higher necessity for the shape effect by 6BBOX, namely, by forming from the thickener gate oxide film.

In FIG. 11, a method of other manufacturing method is to be explained with some modification to the manufacturing method explained with reference to FIG. 6–FIG. 10.

Figure 11A:
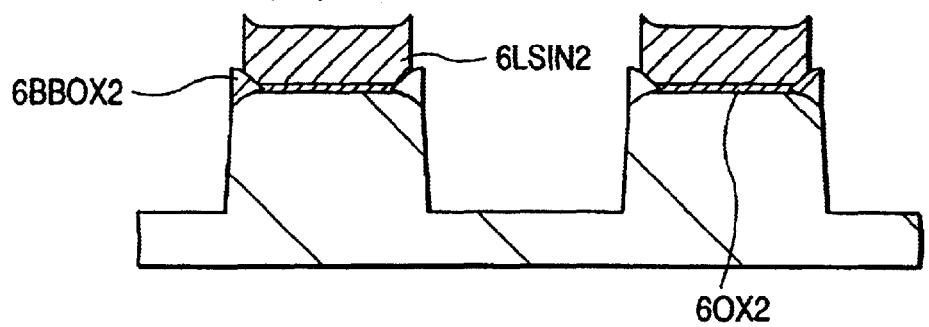
FIG. 11 is a cross sectional view illustrating a manufacturing method according to the present invention.
Figure 11B:
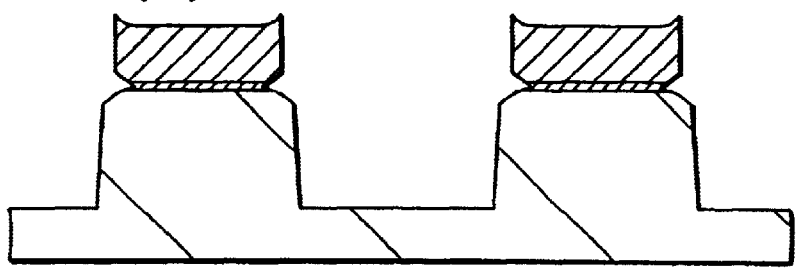
Figure 11C:
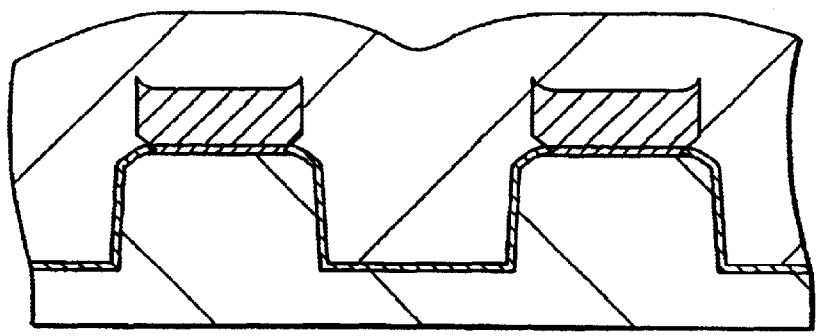
Figure 11D:
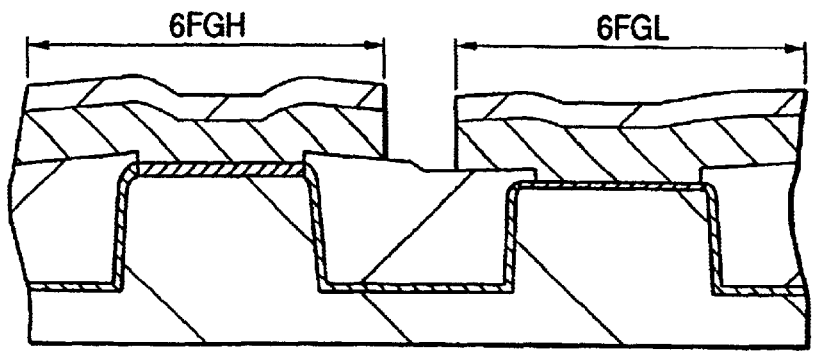

FIG. 11a is a cross sectional view corresponding to the same step as for FIG. 8a. In this stage, 6BBOX2 corresponding to 6BBOX in FIG. 8a is removed isotropically from the lateral side and the upper surface (FIG. 11b). Hydrofluoric acid is preferably used for removal. It has to be noted such that removal of 6BBOX2 before exposure of the side wall of 6BBOX 2 has to be avoided. This is because exposure time to hydrofluoric acid has to be increased by so much if the lateral side is not exposed, and etching proceeds as far as 60X2 to bring about a worry that the thermal oxide mask layer LSIN62 fabricated at a fine size may be peeled off. After removing 6BBOX2, inside of the groove is oxidized to fill the inside of the shallow groove those after FIG. 8c and an MOS structure is completed at FIG. 11d. It will be understood that the shape of the surface edge of shallow groove on the side of the substrate is that of the present invention.

Figure 12:
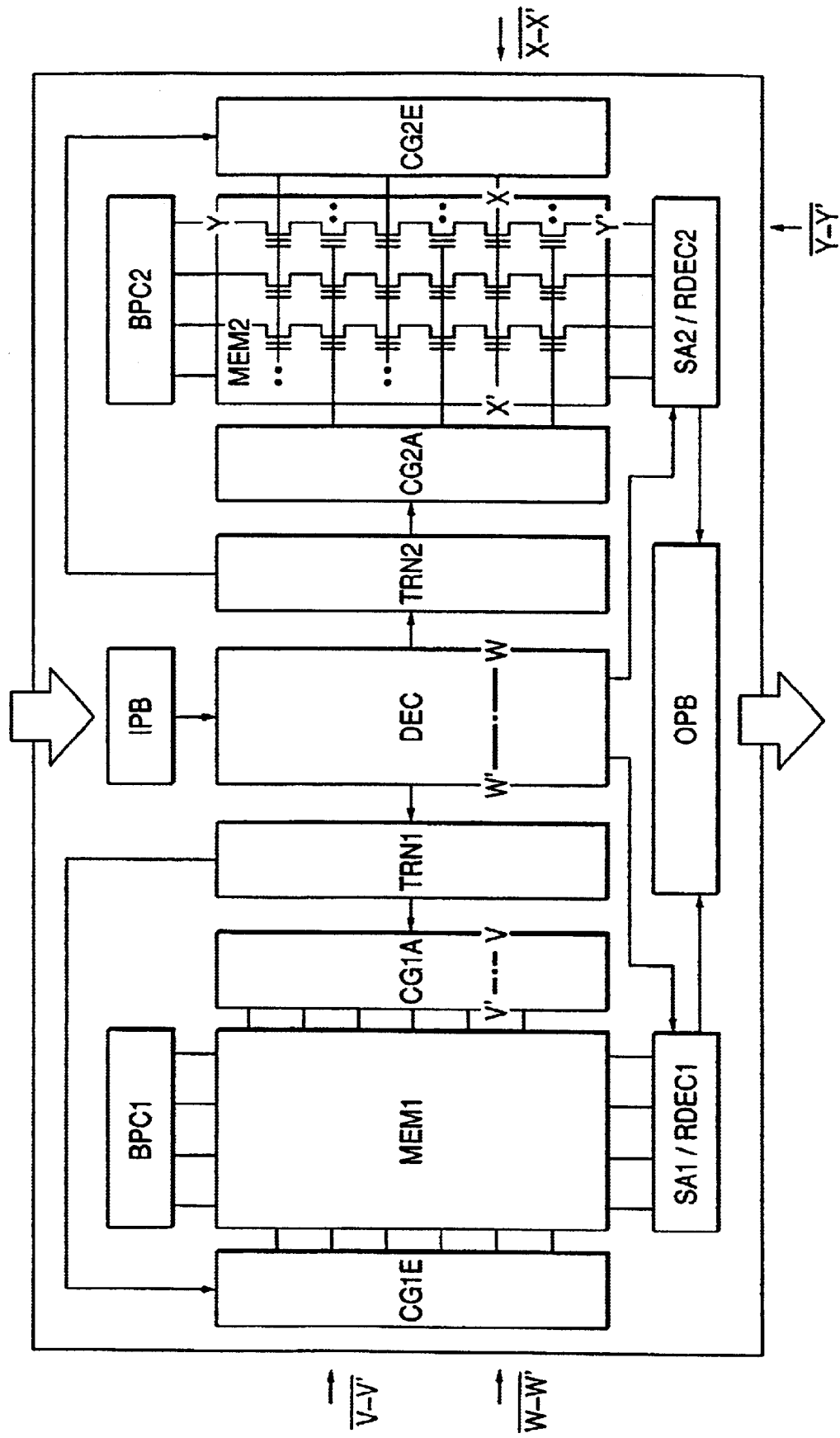
FIG. 12 is a circuit block diagram of a semiconductor nonvolatile memory.

FIG. 12 is a circuit block diagram for a nonvolatile semiconductor memory. The memory comprises an input buffer IPB inputted with address and data from the outside, column address decoder DEC, row address decoders RDED1 and RDEC2, memory arrays MEM1 and MEM2, voltage converter circuits TRN1 and TRN2 for transfer gate grooves CG1A, CG1E, CG2A and CG2E of control gates, bit line pre-charge circuits BPC1 and BPC2, sense circuits SA1 and SA2, and an output bugger OPB.

Now, it is necessary to apply a high voltage of about 20 V to the control gate, and TRN1 and TRN2 are high voltage generation circuits therefor. The transfer gate groups CGA1, CGE1, CBA2 and CGE2 for receiving the same also treat high voltage. Accordingly, MOS transistors having thick gate oxide films are necessary for TRN1, TRN2, CGA1, CGE1, CGA2 and CGE2. The feature of the present invention is to set the surface edge of the shallow groove in contact with each of the gate oxide films to the above-mentioned shape in comparison between the MOS transistors described above and MOS transistors constituting other circuit groups.

Figure 21:
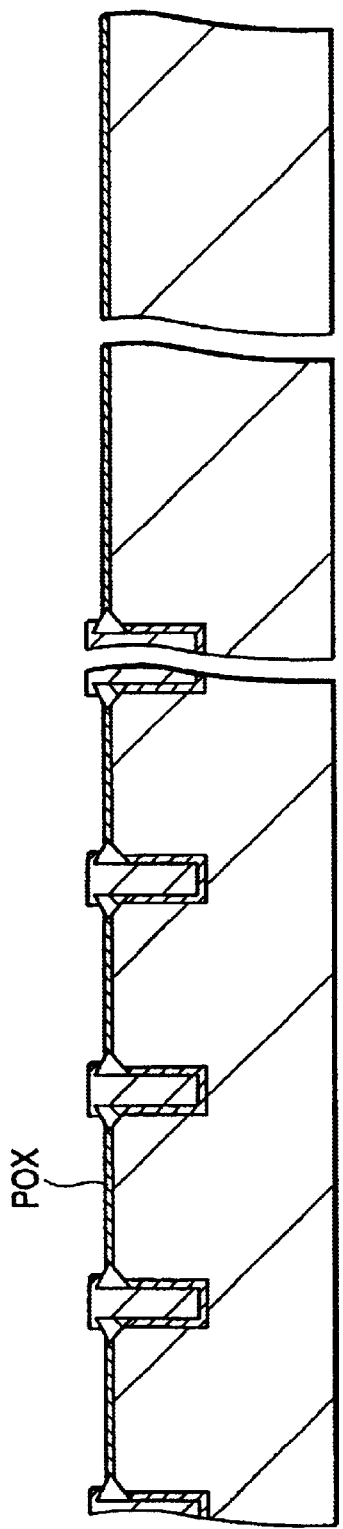
FIG. 21 is a cross sectional view illustrating steps of manufacturing a nonvolatile memory using the present invention.
Figure 22:
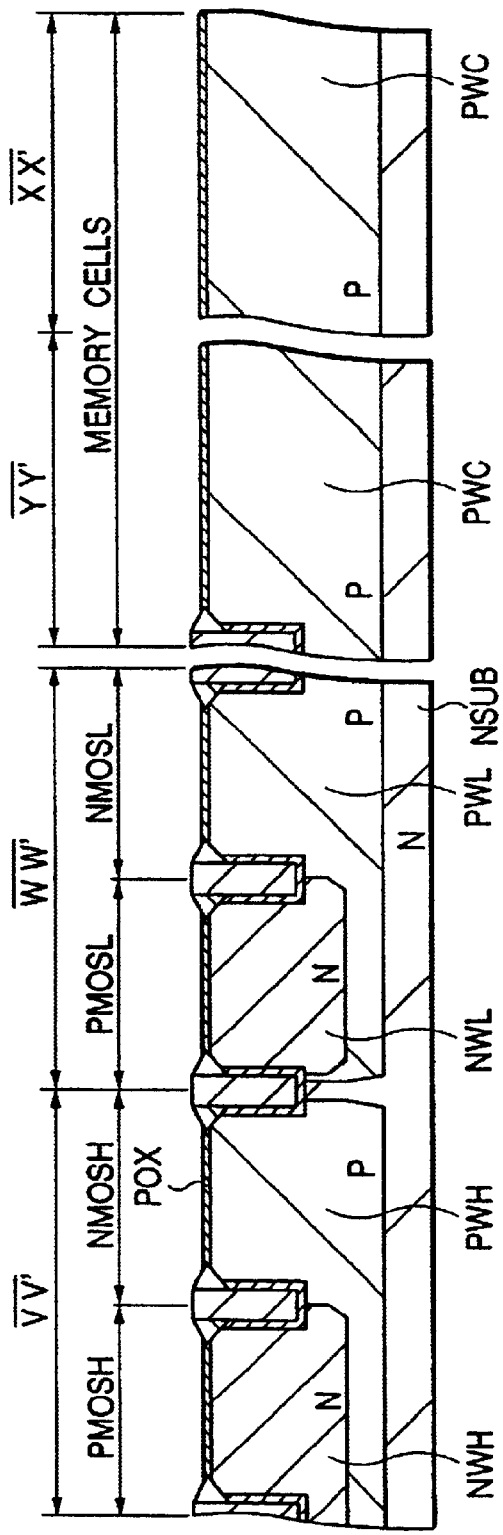
FIG. 22 is a cross sectional view illustrating steps of manufacturing a nonvolatile memory using the present invention.

FIG. 13 to FIG. 38 are cross sectional views of manufacturing steps for the device shown in FIG. 12. V–V', and W–W' in FIG. 12 show cross sectional areas for CGA1 and DEC which correspond to cross sectional areas of an MOS transistor having a thick gate oxide film and an MOS transistor having a thick gate oxide film disclosed in FIG. 13 to FIG. 38, respectively. X–X' and Y–Y' in FIG. 12 show cross sectioned portions in the direction of the data line and in the direction of the word line in a memory array correspond to the cross sectional views of a memory cell area disclosed in FIG. 13 to FIG. 38. Correspondence of the relation is shown in FIG. 22.

The method of manufacturing an NAND type nonvolatile memory described above is to be explained by cross sectional views with reference to FIG. 13 to FIG. 38 but it should be understood that the numerical values shown therein do not restrict the scope of the: present invention. The gate oxide film thickness of the MOS transistors is assumed as 40 nm in a case of a thick gate, 15 nm in a case of thin gate and 10 nm in a case of a tunnel oxide film of a memory cell.

Figure 13:
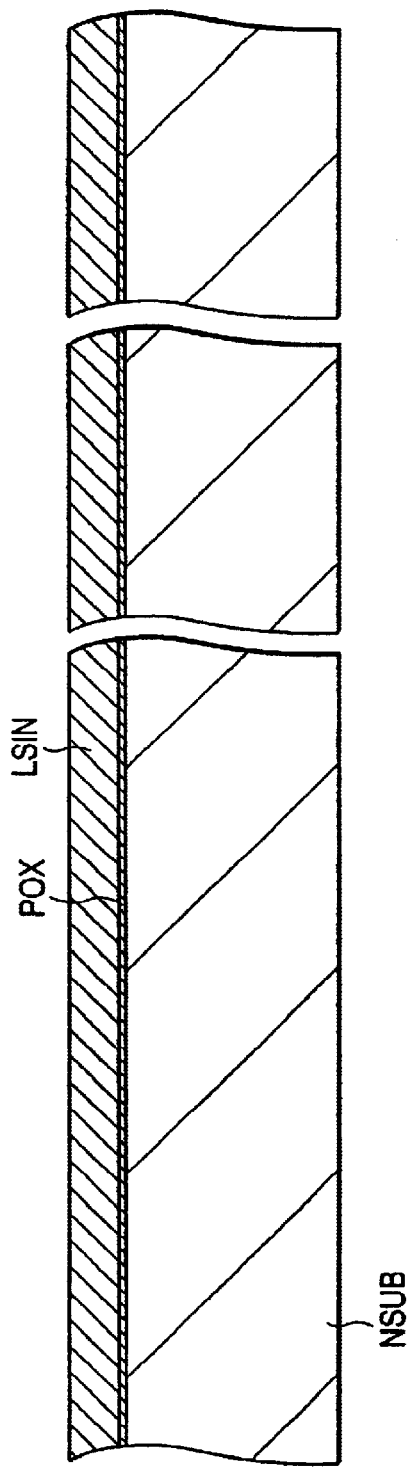
FIG. 13 is a cross sectional view illustrating steps of manufacturing a nonvolatile memory using the present invention.
Figure 14:
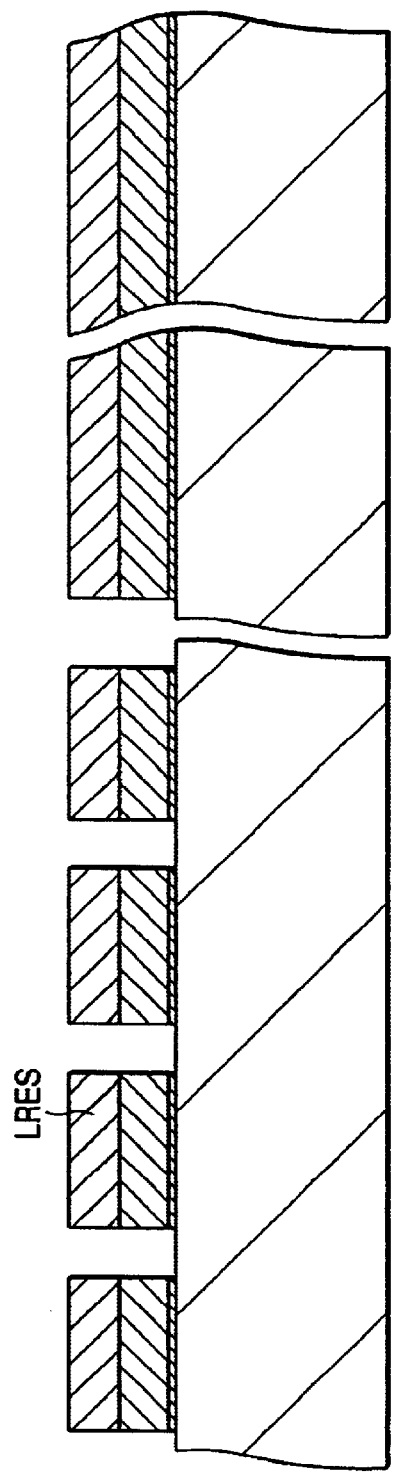
FIG. 14 is a cross sectional view illustrating steps of manufacturing a nonvolatile memory using the present invention.

At first, a pad thermal oxide film POX of 15 nm thickness is formed on an n-type silicon substrate NSUB, and a silicon nitride film LSIN of 250 nm thickness is deposited just thereon (FIG. 13). LSIN and POX are removed only in the area for forming device isolation structures by a dry etching technique using a resist LRES formed by photolithography as a mask (FIG. 14). Then, after removing LRES and conducting washing, a thermal oxide film BOX is formed (FIG. 15) The thickness of BOX is set to 100 nm or less. In the steps so far, BOX is formed in the same manner as existent LOCOS device isolation film but it is not necessary to provide the device isolation function by BOX itself.

Now, after forming BOX, a spacer SWP comprising polysilicon is formed on the side wall of LSIN. As has been explained specifically with reference to FIGS. 5a to 5d, the thickness of SWP is set such that the bottom edge of SWP is present on the area where the bottom of BOX is inclined. In this embodiment, the thickness is set to 40 nm (FIG. 16). After forming SWP, BOX exposed at the surfaces is removed by anisotropic dry etching to expose NSUB. LSIN is also retracted upon etching BOX, and the thickness of LSIN is about 190 nm. SWP remains with no substantial retraction. A portion of BOX remained just below SWP is formed into BBOX (FIG. 17). A shallow groove GR for device isolation is opened in NS10B by anisotropic dry etching. The depth is set to 350 nm. Since the height of SWP is the sum for LSIN (190 nm) and the film thickness of POX (15 nm), namely, 205 nm, it is removed simultaneously upon forming the shallow groove of 350 nm (FIG. 18).

Figure 19:
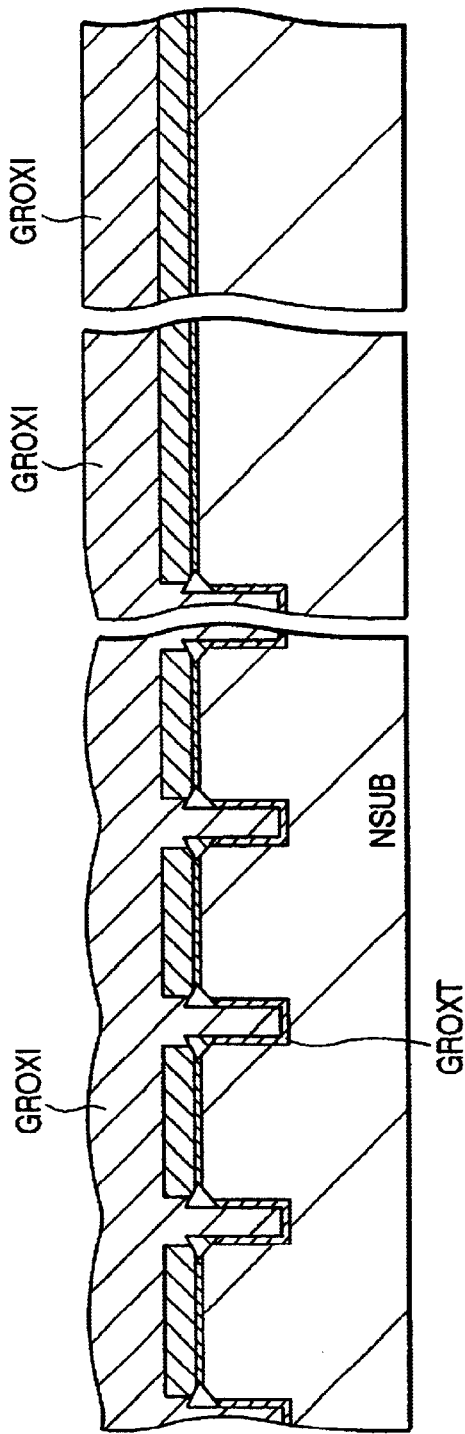
FIG. 19 is a cross sectional view illustrating steps of manufacturing a nonvolatile memory using the present invention.
Figure 20:
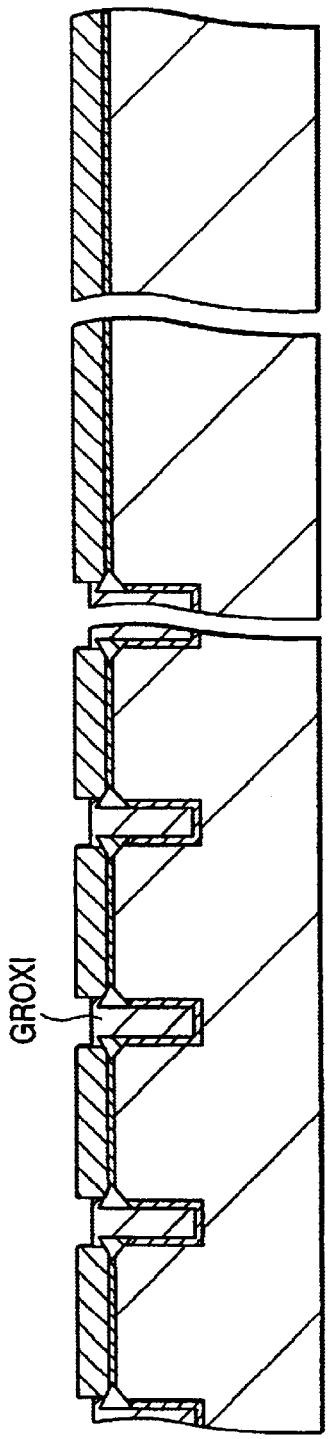
FIG. 20 is a cross sectional view illustrating steps of manufacturing a nonvolatile memory using the present invention.

The surface of NSUB exposed to the inner wall of GR is thermally oxidized into GROXT. The film thickness is set to 15 nm. Subsequently, a silicon oxide film GROX1 is deposited over the entire surface to completely fill the inside of GR. The thickness of the deposition film is 600 nm. For the deposition of GROX1, usual chemical vapor deposition, a method of using the silicon oxide film formed from an organic material in an ozone atmosphere or a method of depositing silicon oxide film in high density plasmas or the like is useful (FIG. 19). Successively, the entire surface is polished by using CMP till the surface of LSIN is exposed (FIG. 20.) When exposed LSIN is completely removed with hot phosphoric acid, POX is exposed to the surface (FIG. 21). A well of an MOS transistor is formed by a non-ion implantation technique using a photoresist as a mask. NWH is an n-well of a p-type MOS transistor PMOSH having a thick gate oxide film, and PWH is a p-wall of an n-type MOS transistor nMOSH having a thick gate oxide film. NWL is an n-well of a p-type MOS transistor PMOSL having a thin gate oxide film and PWL is a p-well of an n-type MOS transistor NMOSL having a thin gate oxide film (FIG. 22).

Figure 23:
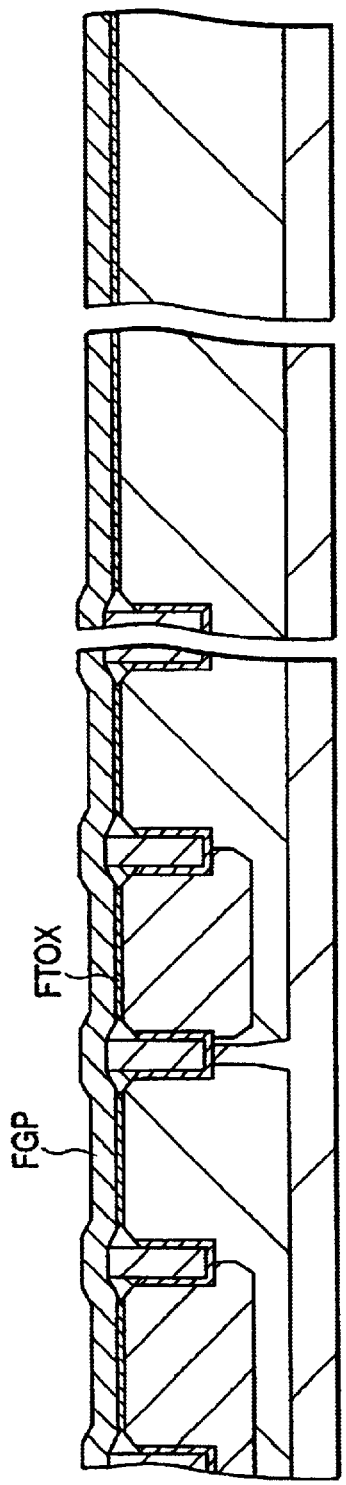
FIG. 23 is a cross sectional view illustrating steps of manufacturing a nonvolatile memory using the present invention.
Figure 24:
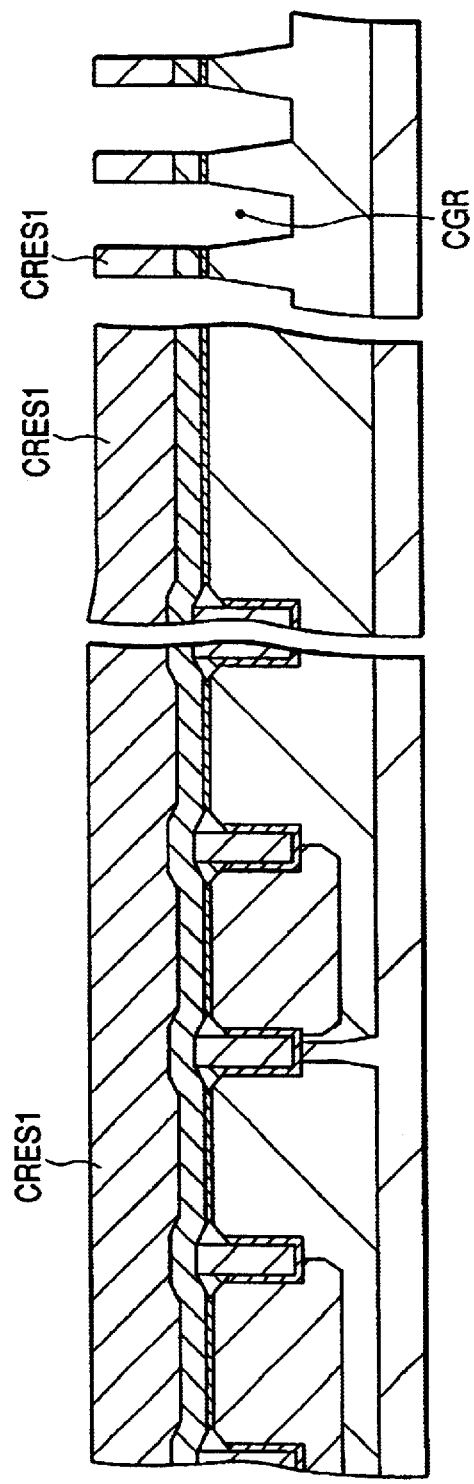
FIG. 24 is a cross sectional view illustrating steps of manufacturing a nonvolatile memory using the present invention.

POX over the entire surface is once removed and thermal oxidation is applied again to form a thermal oxide film FTOX on the surface of NSUB. The thickness of FTOX is 10 nm. A polysilicon FGP is of 150 nm thickness is deposited just on FTOX (FIG. 23). Then, EGP and FTOX are fabricated in the direction of data lines of memory cell groups by anisotropic dry etching using a photoresist CRES1 as a mask to continuously form shallow grove CGR for memory cell in NSUB. The depth of CGR is 350 nm (FIG. 24).

After completely removing CRES1, a thermal oxide film CGROX1 is formed on the surface of NSUB exposed to the inner wall of CGR. The thickness of the film is 10 nm. A silicon oxide film CGEOX1 is deposited over the entire surface to completely fill the shallow groove CGR. Since the width of CGR is narrower than that in the area where other MOS transistors are formed, the deposition film thickness of CGROX1 is set to 400 nm which is thinner than that for GROX1. The material may be similar with that for GROX1, or BPSG (borophospho silicate glass) having high thermal fluidity may also be used (FIG. 25). However, when BPSG is used, it is necessary to dispose a silicon oxide film of about 100 nm thickness not containing impurities between CGROXT and CGROX1 (not illustrated in the figure). CGROX1 is retracted by dry etching till FGP in the memory cell area is exposed (FIG. 26).

Figure 27:
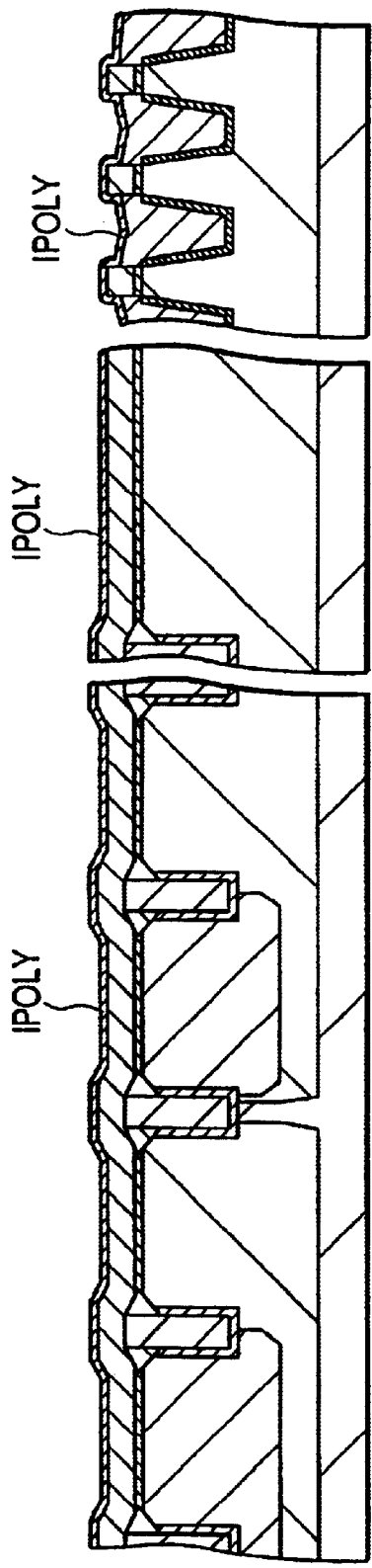
FIG. 27 is a cross sectional view illustrating steps of manufacturing a nonvolatile memory using the present invention.
Figure 28:
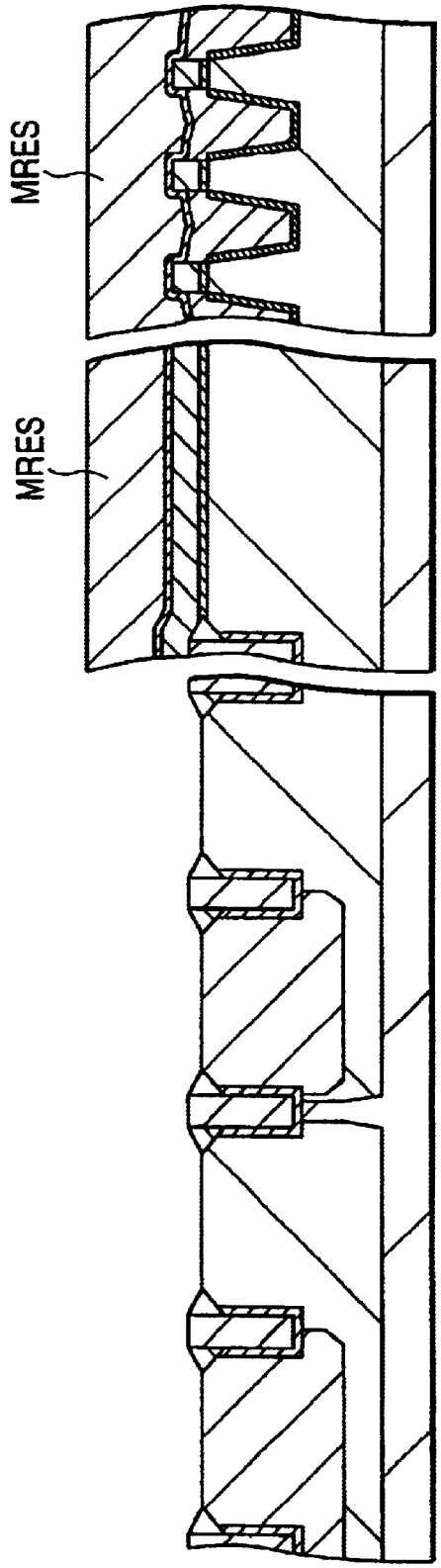
FIG. 28 is a cross sectional view illustrating steps of manufacturing a nonvolatile memory using the present invention.

After cleaning the surface, a polycrystal silicon interlayer insulation film IPOLY is deposited over the entire surface. The film thickness is 15 nm (FIG. 27). The memory cell area is covered with a resist MRBS, and IPOLY, FGP and FTOX in other areas are removed (FIG. 28).

Figure 29:
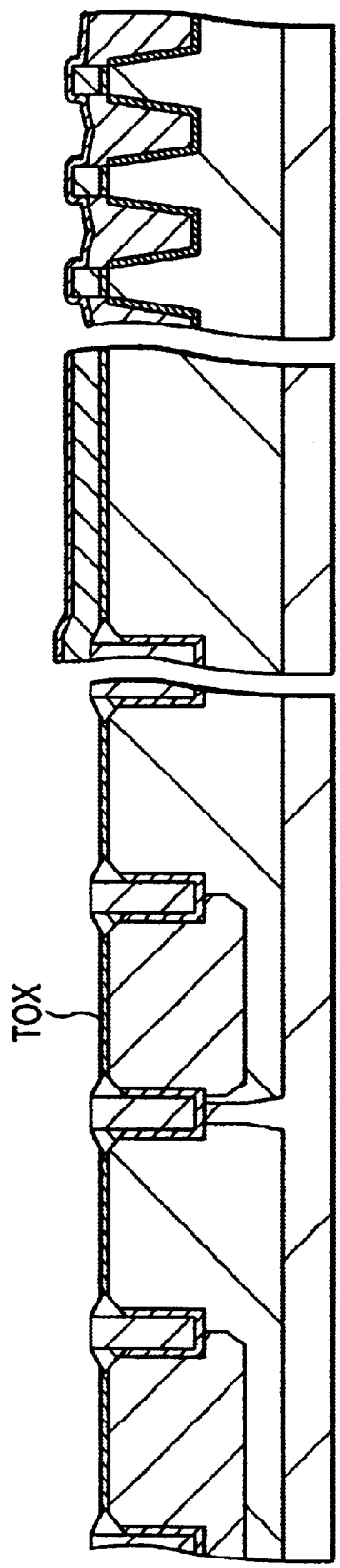
FIG. 29 is a cross sectional view illustrating steps of manufacturing a nonvolatile memory using the present invention.
Figure 30:
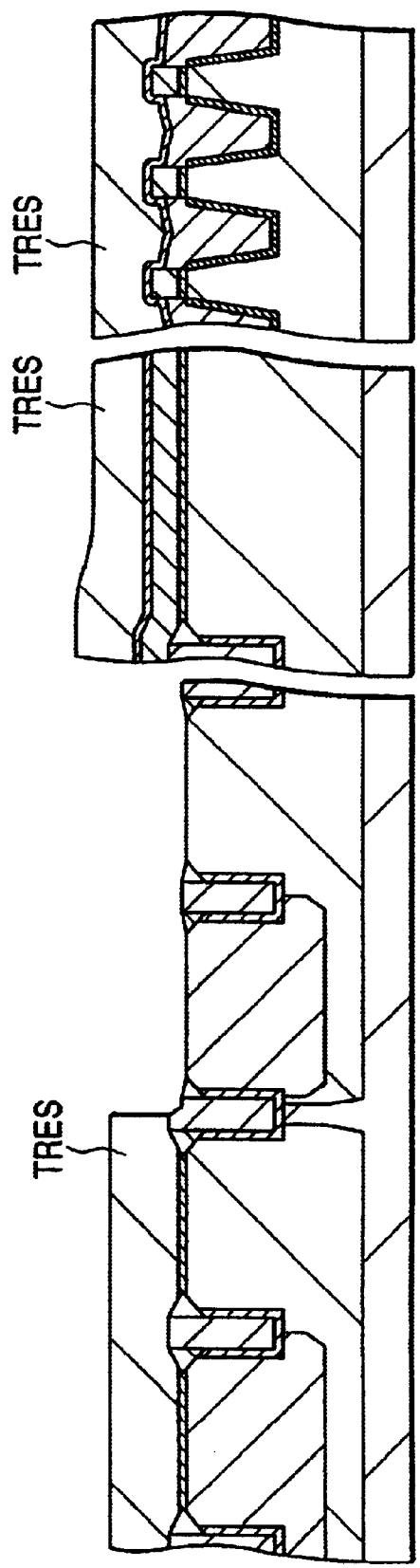
FIG. 30 is a cross sectional view illustrating steps of manufacturing a nonvolatile memory using the present invention.

After removing MRES, a thermal oxide film TOX is formed to a area removed with FTOX. The film thickness is 30 nm (FIG. 29). FTOX is removed only in the area to form a thin gate oxide film by using TRES as a mask (FIG. 30).

Figure 31:
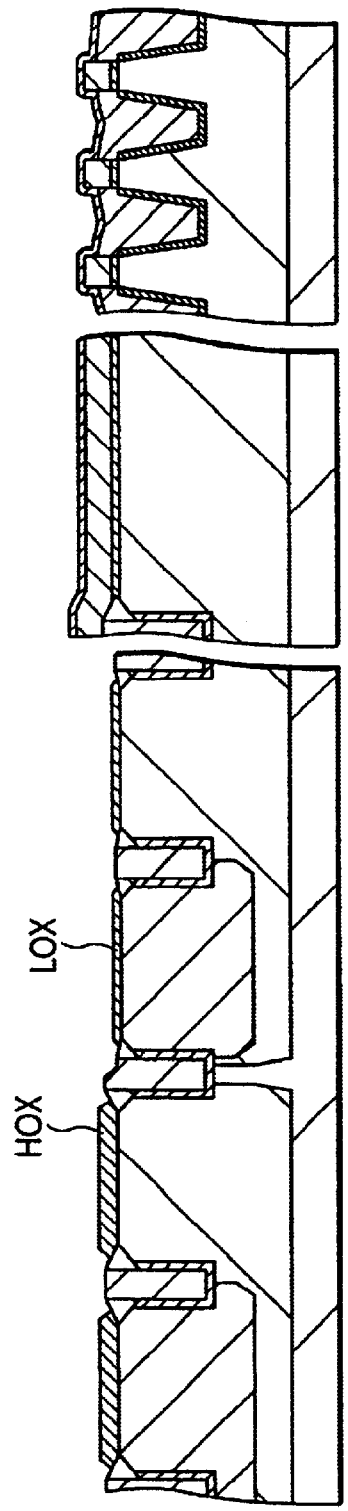
FIG. 31 is a cross sectional view illustrating steps of manufacturing a nonvolatile memory using the present invention.
Figure 32:
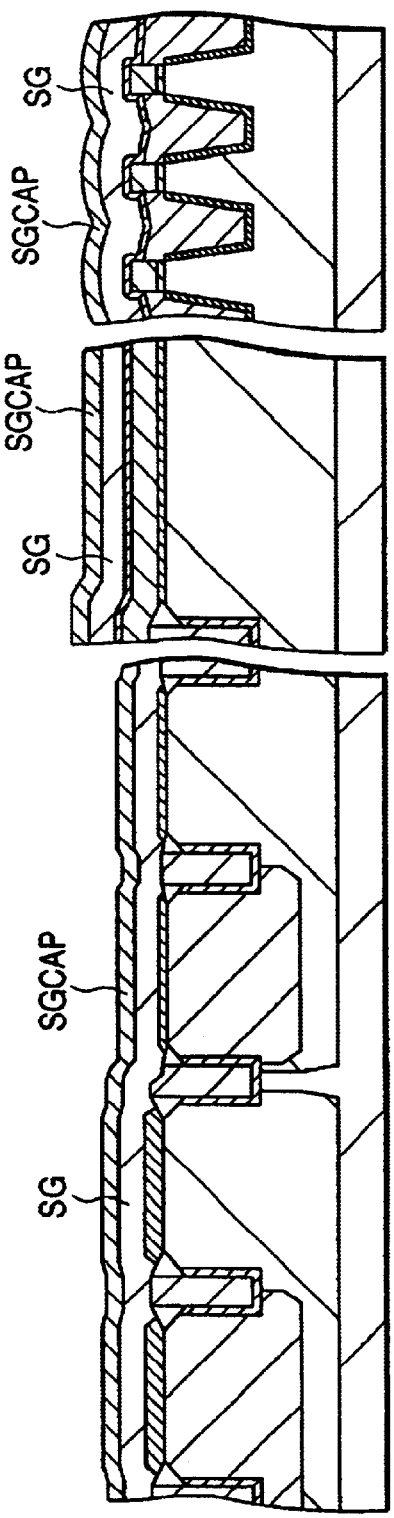
FIG. 32 is a cross sectional view illustrating steps of manufacturing a nonvolatile memory using the present invention.

After removing TRES, a thermal oxide film LOX of 15 nm thickness is formed to an area in which NSUB is exposed. In this step, remained TOX undergoes oxidation again and is converted to thermal oxide film HOX of 40 nm thickness (FIG. 31). Polysilicon SG containing phosphorus by $3 \times 20^{20}$ is deposited to 100 nm over the entire surface, and a silicon oxide film SBCAP is deposited to 100 nm just thereon. SGCAP is used for preventing impurities from intrusion into the inside of SG upon ion implantation for forming source and drain for each of MOS transistors (FIG. 32).

SGCAP and SGCAP are fabricated by anisotropic dry etching using the a photoresist SGRES as a mask (FIG. 33). SCRES is once removed, and an area other than the memory cell area is covered with CRES2. Subsequently, exposed IPOLY and FGP were anisotropically dry etched using CRES2 as a mask (FIG. 34).

Figure 35:
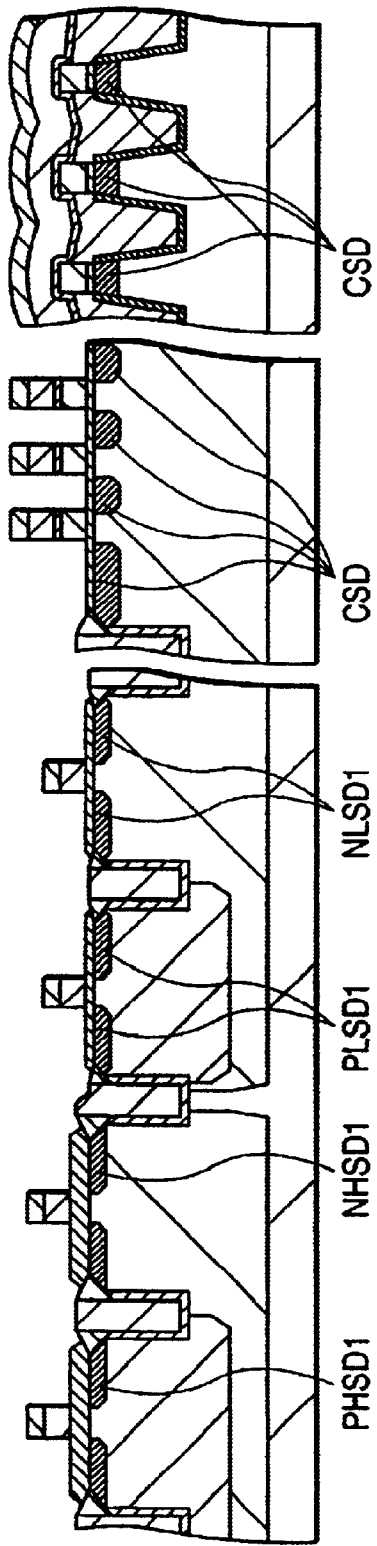
FIG. 35 is a cross sectional view illustrating steps of manufacturing a nonvolatile memory using the present invention.

Source and drain of each of the transistors are formed by ion implantation. PHSD1 is p-type source and drain for PMOSH, NHSD1 is n-type source and drain for NMOSNH, PLSD1 is p-type source and drain for PMOSL and NLSD1 is n-type source and drain for NMOSL. CSD is n-type source and drain for the memory cell (FIG. 35).

Figure 36:
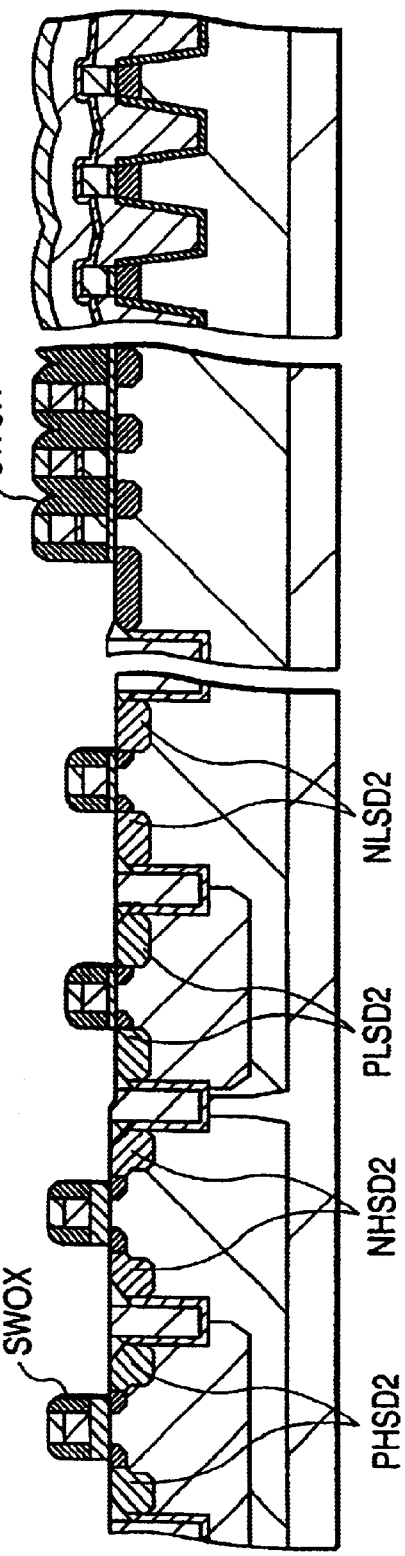
FIG. 36 is a cross sectional view illustrating steps of manufacturing a nonvolatile memory using the present invention.

A spacer SWOX comprising a silicon oxide film is formed to the side wall of the gate electrode. PLSD2 and NLSD2 are, respectively, high density (low resistance) diffusion layers for PMOSL and NMOSL, and formed by ion implantation using SWOX as a mask. PHSD2 is a p-type high density (low resistance) diffusion layer of PMOSH and the junction depth thereof is greater than that of PHSD1. NHSD2 is an n-type high density (low resistance) diffusion layer of NMOSH and the junction depth thereof is greater than that of NHSD1. For both of PHSD2 and NHSD2, areas are defined by a resist mask without using self aligned ion implantation by the side wall spacer of the gate electrode. That is, they are formed as offset type diffusion layers by the mask. This is because PMOSH and NMOSH to be used in this embodiment are based on the premis that they are driven at a high voltage of about 20 V and a sufficient diffusion offset length has to be ensured (FIG. 36). Heat treatment for activation of impurities is conducted in an $N_2$ atmosphere at a temperature of from 800 to 900° C. Whether the heat treatment is conducted at once after implanting all ions or conducted or divisionally may be determined in view of the characteristics of transistors to be formed.

Figure 37:
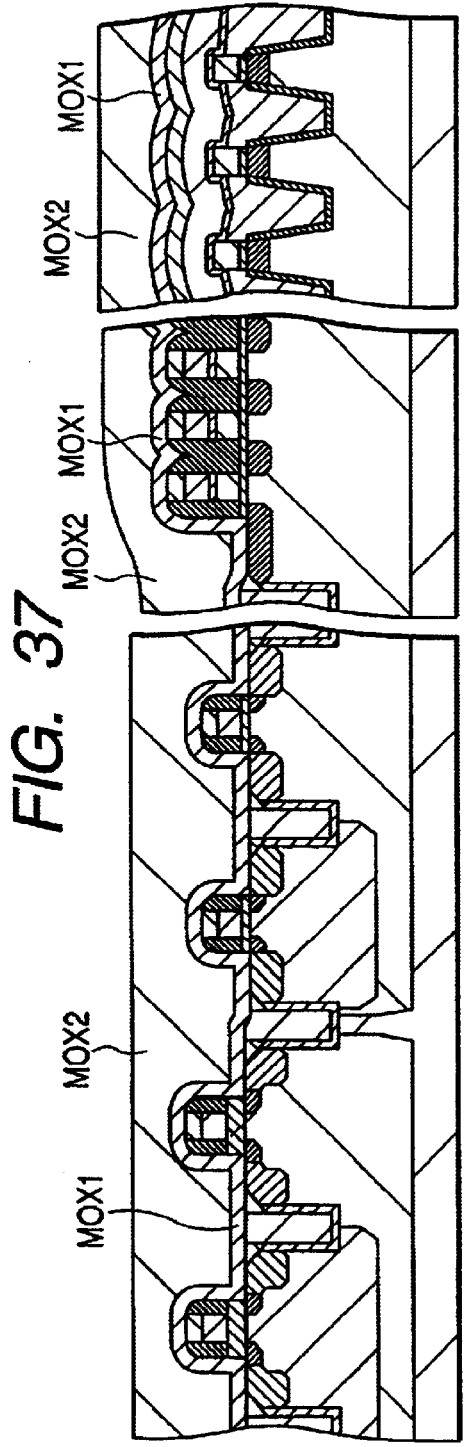
FIG. 37 is a cross sectional view illustrating steps of manufacturing a nonvolatile memory using the present invention.
Figure 38:
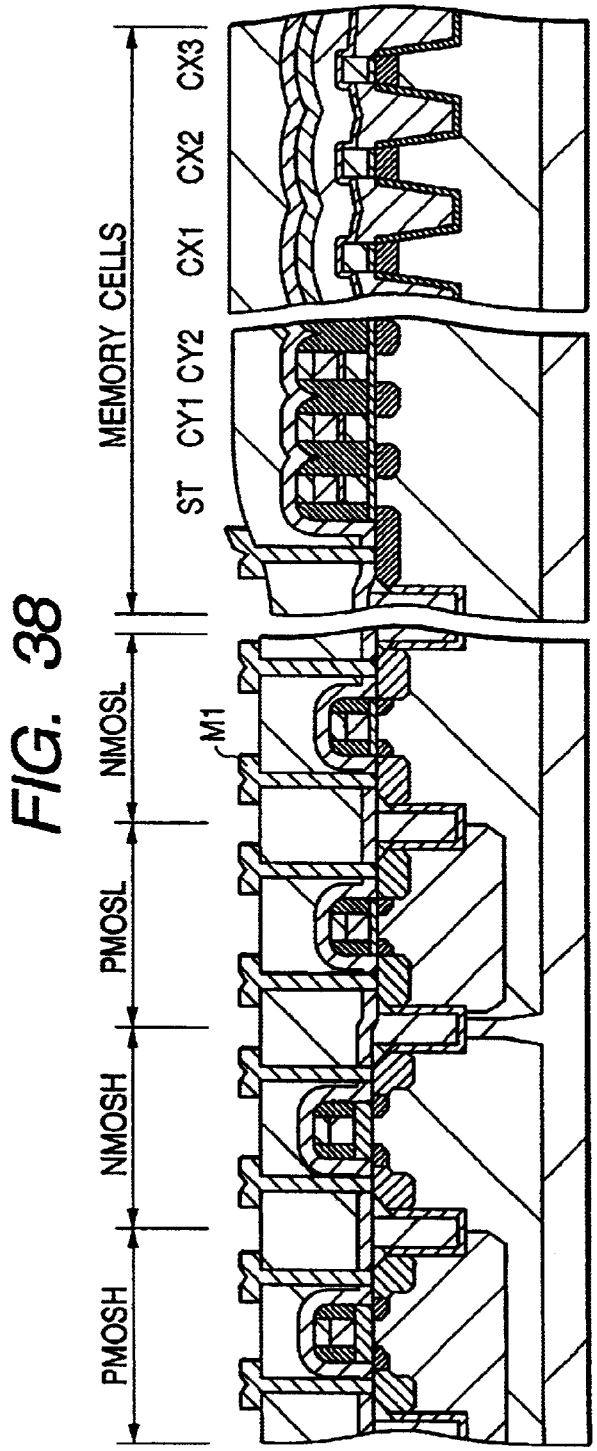
FIG. 38 is a cross sectional view illustrating steps of manufacturing a nonvolatile memory using the present invention.

A silicon oxide film MOS1 not containing impurities is deposited to 100 nm thickness over the entire surface. MOX2 (material BPSG: borophospho silicate glass) was deposited to 350 nm thickness just thereon and a heat treatment is applied in an $N_2$ atmosphere at a temperature of 85° C. for 20 min. MOX1 serves to prevent diffusion of impurities from MOX2 to transistors. Further, it is desirable for the protection of the transistor to dispose MOX2 by way of silicon oxide film MOX1 by a usual chemical vapor deposition method while other silicon oxide films may also be used (FIG. 37). MOX1 and MOX2 are apertured by photolithography and dry etching and desired diffusion layers or wells are connected with each other by using a first wiring layers M1 (FIG. 38). A wiring layer is further necessary for forming the circuit. However, since this is out of the scope of the gist of the present invention, disclosure with reference to the cross sections is made up to FIG. 38.

While the nonvolatile memory is disclosed in FIG. 13 to FIG. 38, it is possible to constitute a circuit for conducting logic operation by using MOS transistors PMOSL and NMOSL each having a thin oxide film. That is, a nonvolatile memory and an operation device can be integrated on one identical substrate. Since the manufacturing method is in accordance with FIG. 13 to FIG. 38, it is not illustrated but it is extremely useful to apply the present invention to such a semiconductor device.

In addition to "NAND type", the nonvolatile semiconductor device includes, "NOR type", "diNOR type", "contactless array type", "split gate type" and the like and a high voltage is also necessary to them for programming and erase of information. Accordingly, a plurality of levels are required for thickness of the gate oxide films. Also in the case of the above-mentioned types, it is possible and useful to apply the shallow groove isolation structure according to the present invention.

Figure 39:
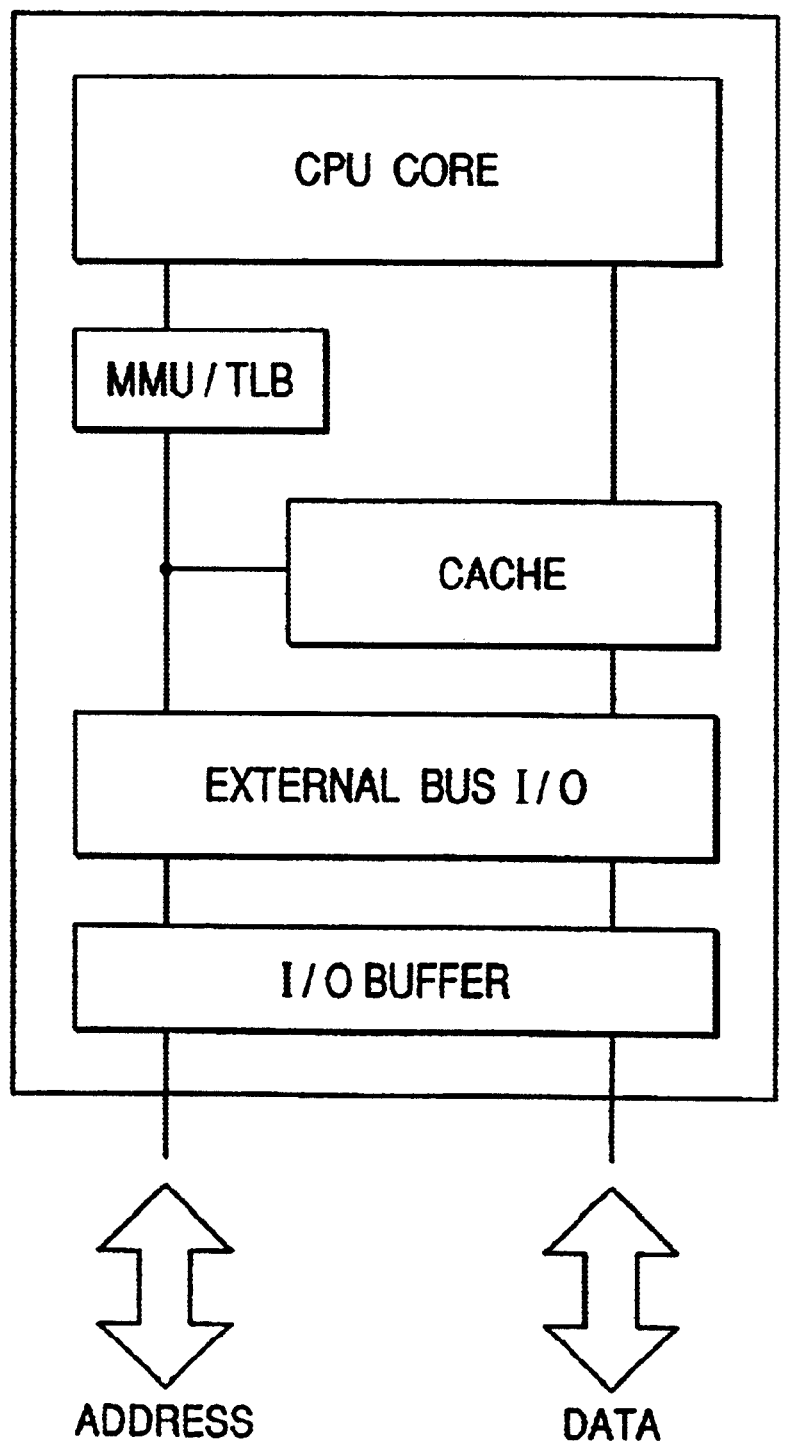
FIG. 39 is a circuit block diagram for a semiconductor microprocessor.

FIG. 39 is a simple circuit block diagram for a microprocessor. The microprocessor comprises an I/O buffer for receiving address and data input from the outside, an external bus I/O for converting the signals, CACHE as a location memory for data and instruction, MMU/TLB for controlling CACHE, and a CPU core for main operation. High operation speed and low power consumption are required for the processor. For lowering the power consumption, it is desired to lower the operation voltage. In the processor, it is design to lower the power source voltage within a range capable of maintaining the operation speed. Accordingly, an MOS transistor having a thin gate oxide film corresponding thereto is necessary. On the other hand, since the operation voltage of the external bus is determined by the standard of the entire system, it can not be lowered optionally as in the internal operation voltage. Therefore, the I/O buffer that sends and receives signals directly to and from the external bus requires devices corresponding to the high operation voltage of the external bath, namely, MOS transistors having a thick gate oxide film. The gate withstand voltage required for the respective MOS transistors can be ensured by setting the curvature R at the corner of the surface edge of the shallow groove on the side of the substrate just below the gate electrode of the MOS transistor used for the I/O buffer to larger than the curvature r at that for the MOS transistor used for the CPU core, by the shallow groove isolation structure according to the present invention.

Further, in the microprocessor, MOS transistors having a thick gate oxide film CACHE in addition to the I/O buffer.

FIG. 40 shows a circuit diagram. Generally, a memory unit of CACHE in a microprocessor comprises six MOS transistors on a substrate. They are p-type MOS transistors Qpr1 and Qpr2 for loading and n-type MOS transistors Qnd1 and Qnd2 for driving, and n-type MOS transistors Qt1 and Qt2 for use in selection. A word line WL, bit lines BL and BL and power sources Vcc and Vss (Vcc>Vss) are also shown.

FIG. 41 is a plan view for an example in which the circuit is arranged on a semiconductor device. Dotted chains X1 and Y2 represent mirror face inversion boundaries in the vertical direction, and dotted chains Y1 and Y2 represent repeating boundary lines in the right to left direction. In FIG. 41, only the boundary line for the shallow groove and the device area, the gate electrode and the well are shown. When the curvature R at the corner of the surface edge of the shallow groove on the side of the substrate (represented by an area F in the drawing) just below the gate electrode of the MOS transistor for use in CACHE is made greater than the curvature r at the corner of the surface edge of the shallow groove on the side of the substrate just below the gate electrode of the MOS transistor for use in the CPU core by applying the present invention, the gate withstand voltage necessary in both of the MOS transistors can be ensured.

In the embodiment of the microprocessor described above, the feature of the present invention is represented by the radius of curvature for the corner at the surface edge of the shallow groove and on the side of the substrate. Alternatively, in accordance with the feature explained with reference to FIG. 2, it may be defined as a relation: $T \geq t$ of the step T between the bottom of the gate oxide film and the top of the shallow groove side wall, of the MOS transistor constituting the I/O buffer or CACHE relative to the step t of the bottom of the gate oxide film and the top of the shallow groove side wall of the MOS transistor constituting the CPU core.

Figure 42:
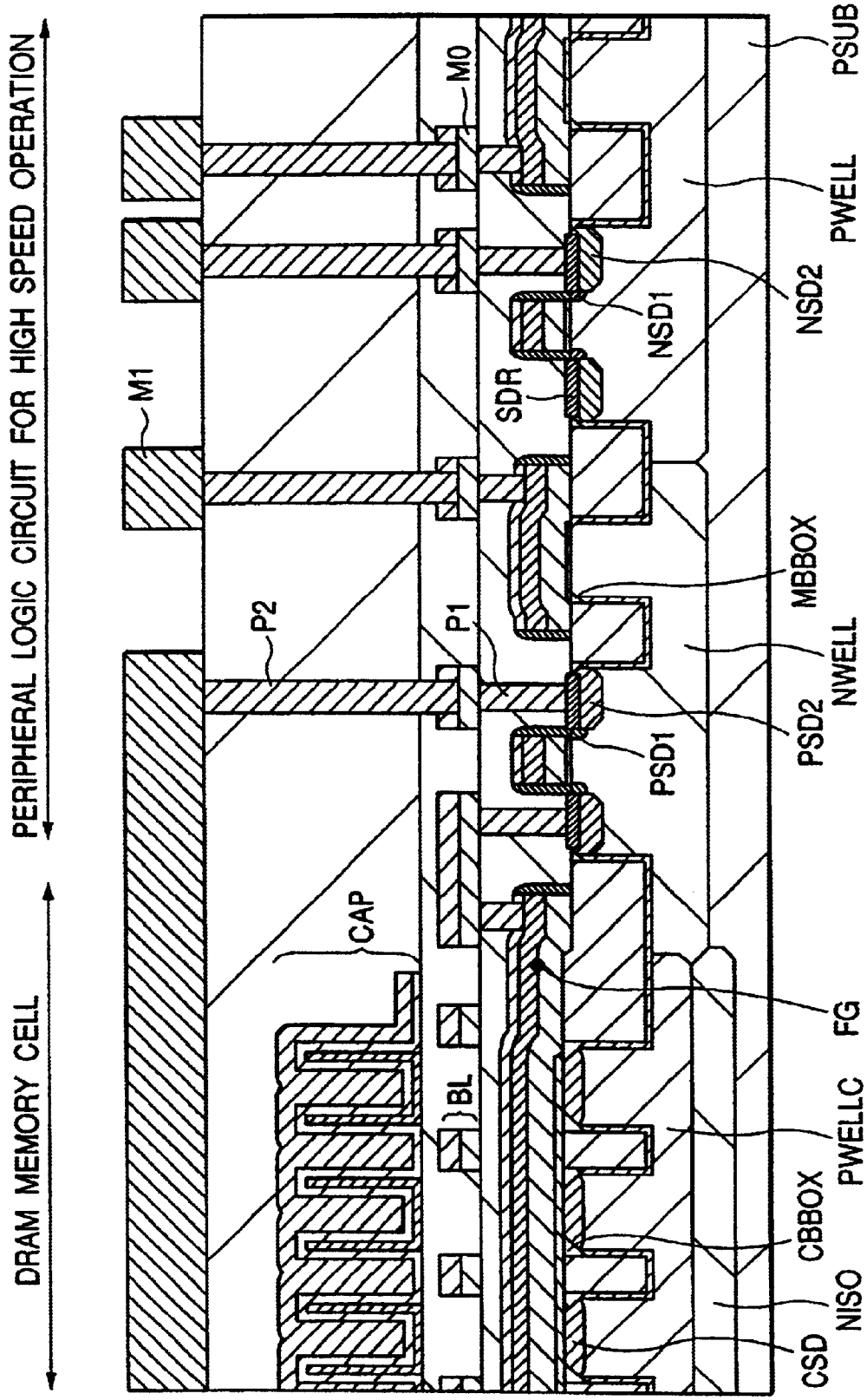
FIG. 42 is a cross sectional view for a semiconductor integrated circuit device in which a DRAM memory cell and a logic operation device are mounted together, using the present invention.

FIG. 42 briefly shows a cross sectional structure of a semiconductor device in which DRAM and a logic circuit are mounted together on one identical substrate. The illustrated structure is generally divided into a memory cell and a peripheral logic circuit. In a p-type silicon substrate PSUB, are provided an n-type layer NISO for isolation of the memory cell area, a p-type well PWELLC for the memory cell, an n-type well NWELL for use in a p-type type MOS transistor of the peripheral logic circuit and a p-type well PWELL for use in the n-type MOS transistor. The shallow groove isolation structure is identical with that disclosed in FIG. 13 to FIG. 38. The thermal oxide film present at the surface edge of the shallow groove is CBBOX in the memory cell area and MBBOX in the peripheral logic circuit. The gate oxide film in the memory cell area is COX and that in the peripheral logic circuit is MOX. The gate electrode FG has a laminate structure made of polysilicon and metal. n-type source and drain of the memory cell is CSD, the source and drain of the p-type MOS transistor in the peripheral logic circuit is an LDD structure comprising PSD1 and PSD2, the source and the drain of the p-type MOS transistor thereof is an LDD structure comprising NSD1 and NSD2. A low resistance layer SDR made of silicide or metal is deposited on the upper surface of the source and drain in both of them. There are shown bit lines BL for the memory cell, locally wiring layers MO and plug P1 for FG and source and drain, a capacitance device CAP for the memory cell, a plug layer P2 filled in the contact hole apertured to MO, and a wiring layer M1.

Since high speed operation is required for the peripheral logic circuit, MOX is thin. On the other hand, in the DRAM memory cell, it is required to set COS somewhat thicker for preventing the leakage current. Accordingly, COX>MOX. It will be understood that the present invention has a feature in that the shape of CBBOX and MBBOX are made different corresponding to the difference of the film thickness as shown in FIG. 1 or FIG. 2. An input protection circuit disposed to the input/output signal lines is constituted in the manner like that DRAM.

Figure 43:
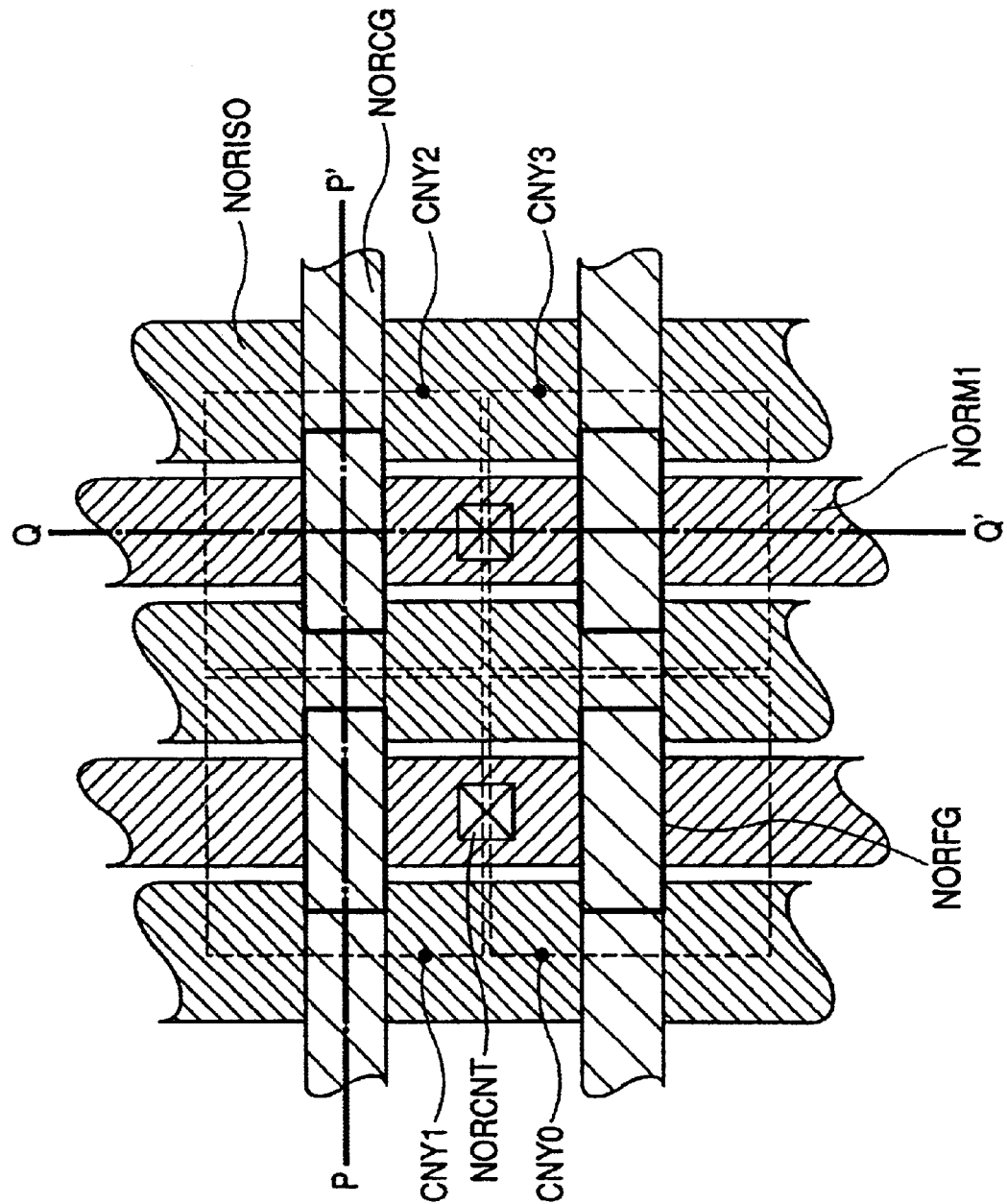
FIG. 43 is a view for the planer arrangement of a memory cell area of an NOR type nonvolatile memory, using the present invention.

FIG. 43 shows a planer arrangement for a memory cell area of an NOR type nonvolatile memory. Four memories CYN0, CNY1, CNY2 and CNY3 are included in the drawing. NORISO is a shallow groove isolation area, NORCG is a control gate for the memory, MORCNT is a contact hole for pulling-up a potential from the diffusion layer of the memory and NORM1 is a wiring layer connected through NORCNT to the diffusion layer of the memory. In this plan view, floating gate electrode NORFG is concealed just below NORCG but it should be noted that FIG. 43 shows this position. A preferred embodiment of the present invention is to be explained with reference to FIG. 44 disclosed next for the cross sectional views along PP' and QQ'.

Figure 44:
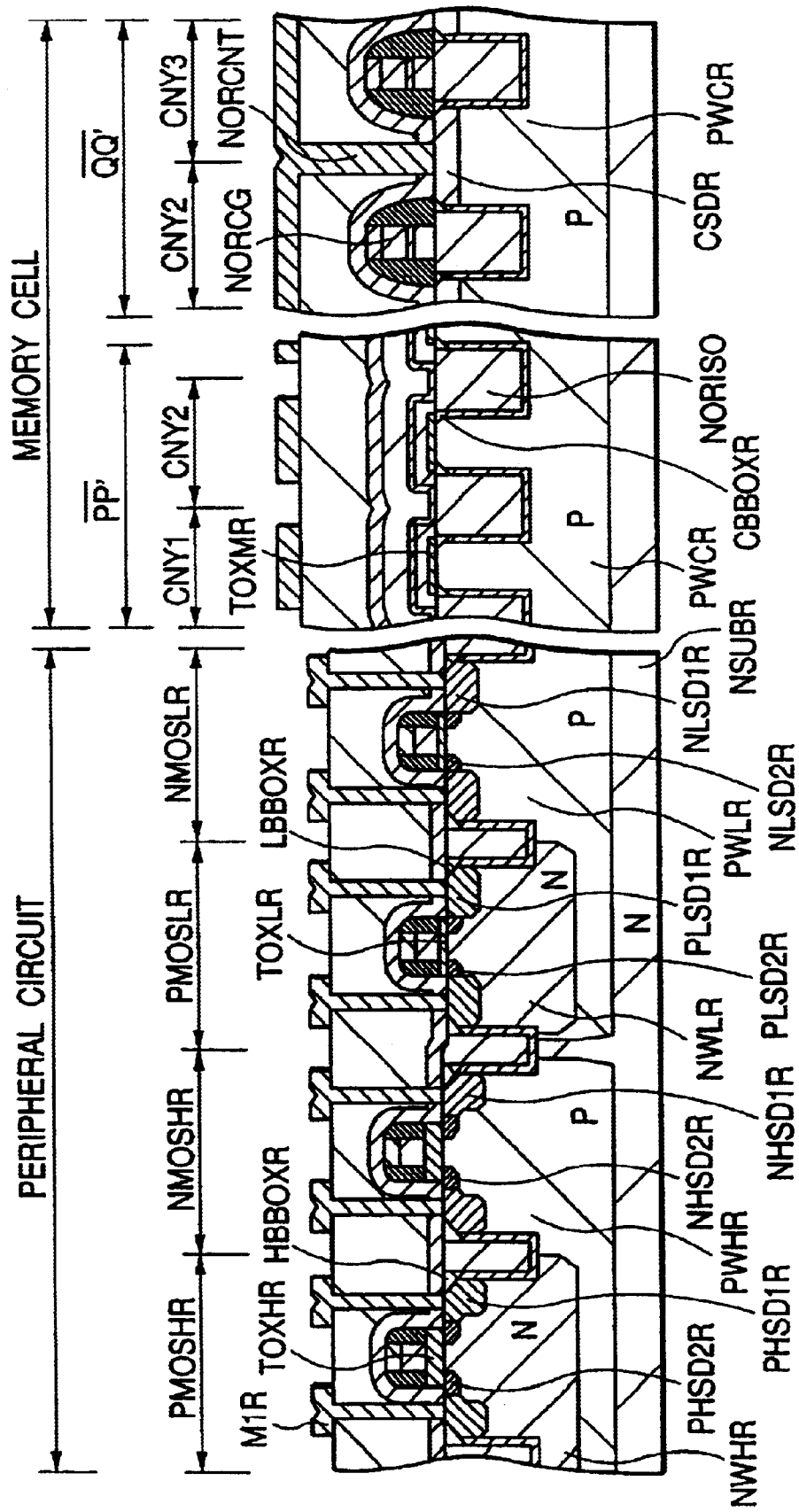
FIG. 44 is a cross sectional view for a semiconductor integrated circuit device including a DRAM memory cell, a peripheral circuit and an input protection circuit using the present invention.

FIG. 44 shows a cross sectional structure of an NOR type nonvolatile memory completed as far as the fabrication for the first wiring layer. The steps are in accordance with those for the NAND type and detailed disclosure for the steps are omitted. The peripheral circuit comprises a p-type MOS transistor PMOSHR, an n-type MOS transistor NMOSHR using a high voltage for driving the control gate and p-type MOS transistor PMOSLR and n-type MOS transistor NMOSLR for treating logics such as address generation.

In the memory cell area, cross sections along PP' and QQ' shown in FIG. 43 are shown. Among four memory cells indicated as CNY0 to CNY3, memory cells CNY1 and CNY2 appear in the PP' cross section and the memory cells CNY2 and CNY3 appear in the CNY2, QQ' cross sections. Reference symbols are to be explained. There are an N-type silicon substrate NSUBR, an n-well NWHR of a p-type MOS transistor PMOSHR having a thick gate oxide film, a p-well PWHR of an n-type MOS transistor NMOSHR having a thick gate oxide film, an n-well NWLR of a p-type MOS transistor PMOSLR having a thin gate oxide film, a p-well PWLR of an n-type MOS transistor NMOSLR having a thin gate oxide film, a p-well PWCR of a memory cell area, a shallow groove isolation area NORISO, a tunnel oxide film TOXMR of a memory cell, a thin gate oxide film TOXLR of a peripheral circuit, a thick gate oxide film TOXHR of a peripheral circuit, a thermal oxide film CBBBXR in a bird's beak shape present at the surface edge of NORISO in contact with TOXMR, a thermal oxide film LBBOXR of a bird's beak shape present at the surface edge of NORISO in contact with TOXLR, a thermal oxide film HBBOXR of a bird's beak shape present at the surface edge of NORISO in contact with TOXHR, a floating gate NORFG of the memory cell, a control gate NORCG of the memory cell, a diffusion layer CSDR of the memory cell, high density source and drain PHSD1R of an p-type MOS transistor having TOXHR as the gate oxide film, LDD source and drain PHSD2R, high density source and drain NHSD1R of an n-type MOS transistor having TOXHR as a gate oxide film, LDD source and drain NHSD2R, high density source and drain PLSD1R of a p-type MOS transistor having TOXLR as a gate oxide film, LDD source and drain PLSD2R, high density source and drain NLSD1R of an n-type MOS transistor having TOXLR as a gate oxide film, LDD source and drain NLSD2R, and a first wiring layer M1R.

The relation for the size of the film thickness in TOXLR, TOXHR and TOXMR is determined while also considering voltage and reliability of MOS transistors using them as the gate oxide film. The shape for the surface edge of NORISO with CBBOXR, LBBOXR and HBBOXR is set in accordance with the relation for the size of the thickness of the gate oxide films by utilizing the present invention.

In addition to "NAND type" or "NOR type" described above, nonvolatile semiconductor devices also include "DiNOR type", "contactless array type", "split gate type" and the like, but they are similar in that a high voltage is required for programming or erase information. Accordingly, a plurality of levels are required for the thickness of the gate oxide film. The shallow groove isolation structure of the present invention is applicable and useful in any of the types described above.

Figure 45:
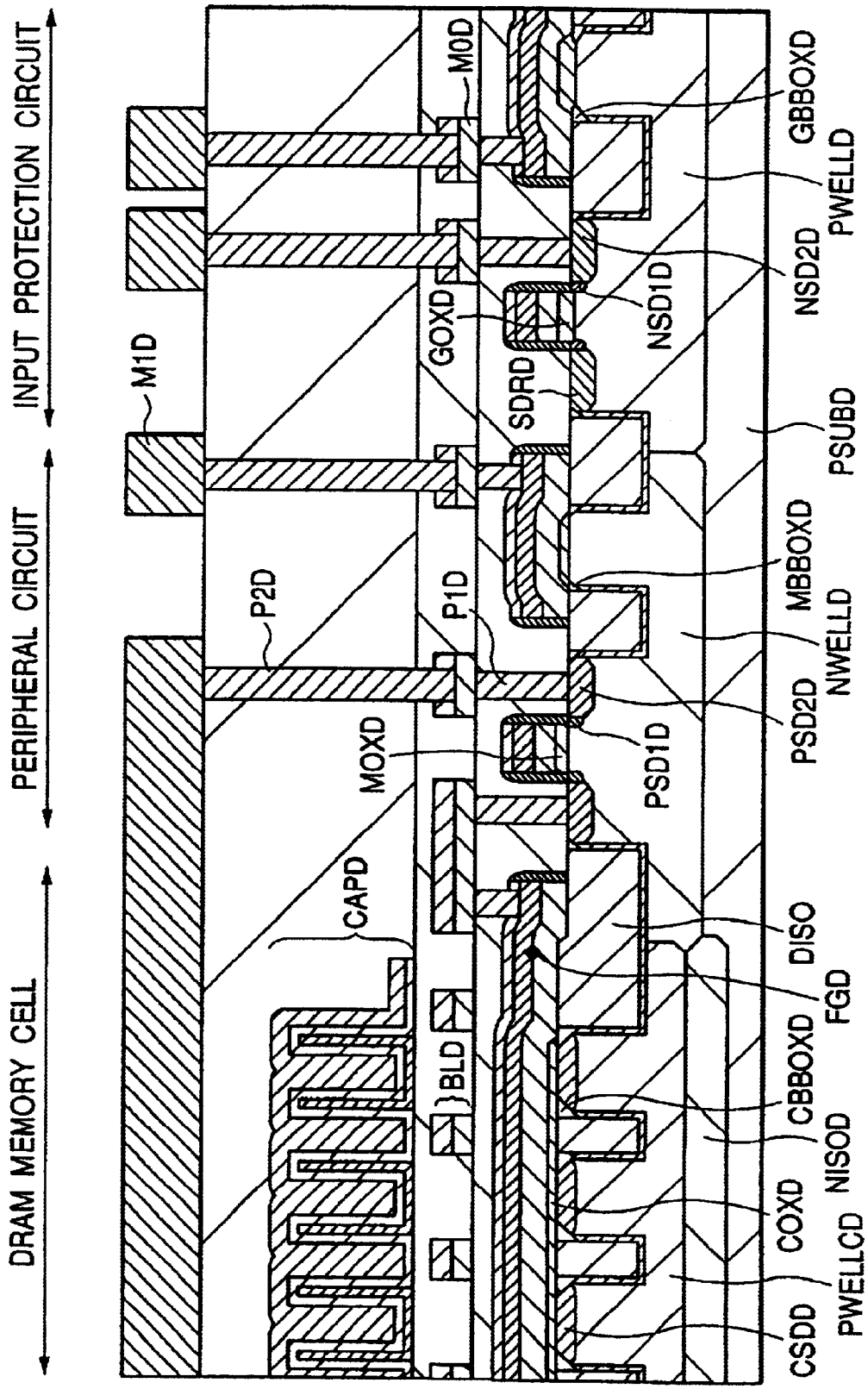
FIG. 45 is a cross sectional view of for a semiconductor integrated circuit device on which a DRAM memory cell and a logic operation device are mounted together, by using the present invention.
Figure 46:
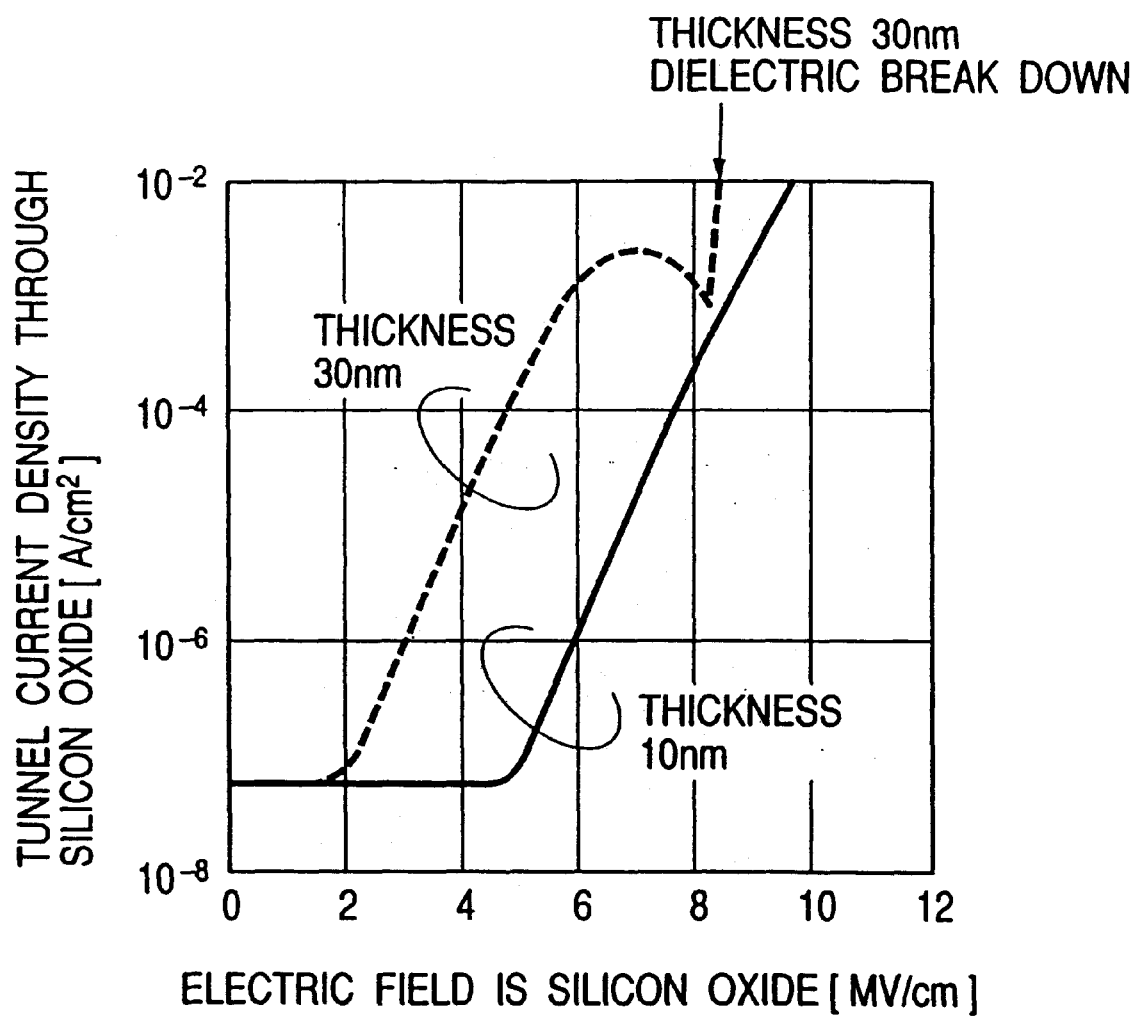
FIG. 46 is a characteristic view for gate oxide film tunnel current of an MOS capacitor, formed by using the prior art.

FIG. 45 is a cross sectional structure for DRAM (Dynamic Random Access Memory) manufactured as far as a first wiring layer. The disclosed structure is generally divided into a memory cell area, a peripheral circuit and an input protection circuit. In a p-type silicon substrate PSUBD, are disposed an n-type layer NISOD for isolation of the memory cell area, a p-type well PWELLCD for use in the memory cell, an n-type well NWELLD for use in a p-type MOS transistor in the peripheral circuit and a p-type well PWELLD for use in the n-type MOS transistor. The shallow groove isolation structure DISO is identical with that disclosed in FIG. 8a to FIG. 8z.

The thermal oxide film present at the surface edge of the shallow groove is CBBOXD in the memory cell area, MBBOXD in the peripheral circuit and GBBOXD in the input protection circuit. The gate oxide film for the memory cell area is COXD, that for the peripheral circuit is MOSD and that for the input protection circuit is GOXD. The gate electrode FGD has a laminate structure comprising polysilicon and metal. n-type source and the drain of the memory cell is CSDD, source and drain of a p-type MOS transistor in the peripheral circuit has an LDD structure comprising PSD1D and PSD2D, and source and drain of the p-type MOS transistor has an LDD structure comprising NSD1D and NSD2D. A bit line of the memory cell is BLD, a layer for locally wiring FGD and source and drain is MOD and a plug P1D, a capacitance device of the memory cell is CAPD, a plug layer filled in the contact hole apertured to MOD is P2D and a wiring layer is M1D.

In view of the manufacturing cost, the thickness of the gate oxide film may be made equal for the MOS transistors used in the memory area the peripheral logic circuit but the thickness of the gate oxide film can not be made identical regarding the input protection circuit. This is because the thin oxide film as used for the peripheral circuit or the memory area can not withstand an instantaneous high voltage noise and the input protection circuit itself is destroyed. Accordingly, a thick gate oxide film is necessary for the input protection circuit, so that a plurality of levels for the film thickness are present together regarding the gate oxide films in the inside of the tip.

The gate withstand voltage can be kept higher when the shape at the surface edge of the shallow groove isolation structure in contact with gate electrode of the input protection circuit is improved by applying the present invention. This embodiment has been explained for an example of DRAM but the situations are identical for input protection circuits in all other semiconductor devices.

Even if a plurality of levels are disposed for the thickness of the gate oxide films, necessary withstand voltage can be ensured for respective gate oxide films. Accordingly, it is possible to realize high integration degree of devices and minimization of a chip area which is the inherent advantage of the shallow groove isolation structure, as well as MOS transistors in semiconductor integrated circuits can be driven at a desired voltage. The present invention is applicable to all semiconductor devices requiring the device isolation structure.

What is claimed is:
1. A semiconductor device comprising trench isolation structure including a plurality of trench isolation regions and MOS structure having a plurality of gate oxide films at a plurality of different levels of thickness on one identical substrate, in which
   a relation: R>r is defined between a radius of curvature R at a surface edge of a first trench, of the trench isolation structure, on the side of a substrate in contact with a gate oxide film of a thickness H and a radius of curvature r at the surface edge of a second trench, of the trench isolation structure, on the side of the substrate in contact with a gate oxide film of a thickness h, where H>h.

2. A semiconductor device comprising trench isolation structure including a plurality of trench isolation regions and MOS structure having a plurality of gate oxide films at a plurality of different levels of thickness on one identical substrate, wherein
   a relation: T>t is defined in which T represents a step between the top of a steepest side wall plane of a first trench, of the trench isolation structure, in contact with a gate oxide film of a thickness H and the bottom of the gate oxide film of a thickness H and t represents a step between the top of the steepest aide wall plane of a second trench, of the trench isolation structure, in contact with a gate oxide film of a thickness h and the bottom of the gate oxide film of a thickness h, where H>h.

3. A semiconductor device comprising trench isolation structure including a plurality of trench isolation regions and MOS structure having a plurality of gate oxide films at a plurality of different levels of thickness on one identical substrate, in which
   a relation D>d is defined wherein D represents a length along a slope continuous from a horizontal bottom of a gate oxide film of a thickness H to the top of a steepest groove side wall plane of a first trench, of the trench isolation structure, in contact with the gate oxide film of a thickness H, and d is a length along an inclined surface continuous from a horizontal bottom of a gate oxide film having a thickness h to the top of the steepest side wall of a second trench, of the trench isolation structure, in contact with the gate oxide film of a thickness h, where H>h.

4. A semiconductor device comprising:
   a plurality of first transistors having a first gate electrode, a first film structure of a thickness D1 formed below the first gate electrode and a first step structure formed below the first film structure,
   a plurality of second transistors having a second gate electrode, a second film structure of a thickness D2 formed below the second gate electrode and a second step structure formed below the second film structure, and
   a trench isolation structure including a plurality of trench isolation regions isolating the first and the second transistors, in which
      a relation: L1>L2 is defined between:
         a length L1 for a line showing the outer profile of the first step structure connecting a linear portion for the stepped portion of the first step structure with a linear portion on the upper part of the first step structure, and a length L2 for a line showing the outer profile of the second step structure connecting a linear portion for the stepped portion of the second step structure with a linear portion on the upper part of the second step structure, in the cross sectional structure of the first and the second transistors with: D1>D2.

5. A semiconductor device comprising trench isolation structure including a plurality of trench isolation regions and MOS structure having gate oxide films of a plurality of different levels of thickness on a silicon substrate, comprising:

at least two circuit blocks selected from a semiconductor nonvolatile memory, a microprocessor, nonvolatile memory, a logic operation device and a memory of DRAM, in which a relation R>r is defined between a radius of curvature R at the surface edge of a first trench, of the trench isolation structure, on the side of the substrate in contact with a gate oxide film of a thickness H and a radius of curvature r at the surface edge of a second trench, of the trench isolation structure, on the side of the substrate in contact with a gate oxide film of a thickness h, where H>h, and gate insulation films having a thickness different from each other are used for at least the two circuit blocks.

6. A semiconductor device comprising including a plurality of trench isolation regions isolation structure and MOS structure having gate oxide films of a plurality of different levels of thickness on a silicon substrate, comprising:

at least two circuit blocks selected from a semiconductor nonvolatile memory, a microprocessor, nonvolatile memory, a logic operation device and a memory of DRAM, in which a relation R>r is defined between a radius of curvature R at the surface edge of a first trench, of the trench isolation structure, on the side of the substrate in contact with a gate oxide film of a thickness H and a radius of curvature r at the surface edge of a second trench of the trench isolation structure on the side of the substrate in contact with a gate oxide film of a thickness h, where H>h.

7. A semiconductor device comprising trench isolation structure including a plurality of trench isolation regions and a transistor structure having gate oxide films of two or more different levels of thickness on a substrate, wherein a relation R>r is defined between a radius of curvature R at the surface edge of a first trench, of the trench isolation structure, on the side of a substrate in contact with a gate oxide film of a thickness H, and a radius of curvature r at the surface edge of a second trench of the trench isolation structure on the side of the substrate in contact with a gate oxide film of a thickness h, where H>h.

8. A semiconductor device comprising trench isolation structure including a plurality of trench isolation regions and a transistor structure having gate oxide films of two or more different levels of thickness on a substrate, wherein a relation: T>t is defined in which T represents a step between the top of the steepest side wall plane of a first trench, of the trench isolation structure, in contact with a gate oxide film of a thickness H and a bottom of the gate oxide film of a thickness H and t represents a step between the top of the steepest side wall plane of a second trench, of the trench isolation structure, in contact with a gate oxide film of a thickness h and the bottom of the gate oxide film of a thickness h, where H>h.

9. A semiconductor device comprising trench isolation structure including a plurality of trench isolation regions and a transistor structure having gate oxide films of two or more different levels of thickness on a substrate, wherein a relation: D>d is defined in which D represents a length along an inclined surface continuous from a horizontal bottom of a gate insulation film of a thickness H to the top of the steepest side wall plane of a first trench, of the trench isolation structure, in contact with the gate oxide film of a thickness H and d represents a length along an inclined surface continuous from a horizontal bottom of a gate oxide film of a thickness h toward the top of the steepest side wall plane of a second trench, of the trench isolation structure, in contact with the gate oxide film of a thickness h, where H>h.

* * * * *